US008883593B2

(12) United States Patent
Nojima

(10) Patent No.: US 8,883,593 B2
(45) Date of Patent: Nov. 11, 2014

(54) METHOD OF MANUFACTURING A PILLAR-TYPE VERTICAL TRANSISTOR

(75) Inventor: Kazuhiro Nojima, Chuo-ku (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/553,392

(22) Filed: Jul. 19, 2012

(65) Prior Publication Data

US 2013/0023095 A1    Jan. 24, 2013

(30) Foreign Application Priority Data

Jul. 20, 2011  (JP) ................................. 2011-158915

(51) Int. Cl.
  *H01L 21/336*   (2006.01)
  *H01L 27/108*   (2006.01)
  *H01L 21/8234*  (2006.01)

(52) U.S. Cl.
  CPC ............... *H01L 27/10876* (2013.01);
        *H01L 21/823487* (2013.01)
  USPC ........... 438/268; 438/212; 438/589; 257/328; 257/302; 257/E29.262; 257/E21.41

(58) Field of Classification Search
  CPC ............ H01L 29/66666; H01L 29/7827; H01L 29/0692; H01L 21/823487
  USPC ............... 257/302, 314, 328–333, E21.41, 257/E29.262, E29.274, E21.657, E27.088, 257/E27.084; 438/589, 268, 212
  See application file for complete search history.

(56) References Cited

U.S. PATENT DOCUMENTS

| | | | | |
|---|---|---|---|---|
| 7,557,396 B2* | 7/2009 | Ando | ............................. | 257/288 |
| 7,842,999 B2* | 11/2010 | Takaishi | ........................ | 257/328 |
| 7,888,737 B2* | 2/2011 | Fujimoto et al. | .............. | 257/347 |
| 8,026,141 B2* | 9/2011 | Masuoka et al. | .............. | 438/268 |
| 8,138,048 B2* | 3/2012 | Masuoka et al. | .............. | 438/268 |
| 2002/0034864 A1* | 3/2002 | Mizushima et al. | .......... | 438/486 |
| 2008/0283907 A1* | 11/2008 | Takaishi | ........................ | 257/328 |
| 2008/0293238 A1* | 11/2008 | Ang et al. | ..................... | 438/621 |
| 2008/0296671 A1* | 12/2008 | Takaishi | ........................ | 257/330 |
| 2008/0296677 A1* | 12/2008 | Takaishi | ........................ | 257/336 |
| 2009/0065856 A1* | 3/2009 | Oyu et al. | ..................... | 257/329 |
| 2009/0212365 A1* | 8/2009 | Fujimoto et al. | .............. | 257/347 |
| 2010/0078712 A1* | 4/2010 | Ikebuchi et al. | .............. | 257/329 |
| 2010/0080032 A1* | 4/2010 | Nojima | ........................... | 365/51 |
| 2010/0087017 A1* | 4/2010 | Masuoka et al. | .................. | 438/9 |
| 2010/0140688 A1* | 6/2010 | Fujimoto | ...................... | 257/329 |

(Continued)

FOREIGN PATENT DOCUMENTS

| | | | |
|---|---|---|---|
| JP | 2003-318388 A | 11/2003 | |
| JP | 2006-237302 A | 9/2006 | |

(Continued)

*Primary Examiner* — Marvin Payen
*Assistant Examiner* — Victor Barzykin
(74) *Attorney, Agent, or Firm* — Sughrue Mion, PLLC

(57) ABSTRACT

A semiconductor pillar which has a first conductivity type and protrudes from a semiconductor substrate, is formed. A bottom diffusion layer having a second conductivity type is formed in the semiconductor substrate around a bottom of the semiconductor pillar. A gate insulator film which covers a side surface of the semiconductor pillar, is formed. A gate electrode which covers the gate insulator film, is formed. A top diffusion layer having the second conductivity type is formed at a top portion of the semiconductor pillar. The top diffusion layer including a semiconductor body is formed by an epitaxial growth which contains an impurity.

16 Claims, 27 Drawing Sheets

(56) References Cited

U.S. PATENT DOCUMENTS

| | | | |
|---|---|---|---|
| 2010/0203714 A1* | 8/2010 | Masuoka et al. | 438/586 |
| 2010/0213539 A1* | 8/2010 | Masuoka et al. | 257/329 |
| 2010/0237407 A1* | 9/2010 | Nojima | 257/329 |
| 2010/0270611 A1* | 10/2010 | Masuoka et al. | 257/329 |
| 2010/0291743 A1* | 11/2010 | Nishi et al. | 438/268 |
| 2011/0006360 A1* | 1/2011 | Ikebuchi | 257/329 |
| 2011/0244602 A1* | 10/2011 | Masuoka et al. | 438/5 |
| 2011/0266615 A1* | 11/2011 | Oyu et al. | 257/329 |
| 2011/0281411 A1* | 11/2011 | Kitamura | 438/268 |

FOREIGN PATENT DOCUMENTS

| | | |
|---|---|---|
| JP | 2008-311641 A | 12/2008 |
| JP | 2009-200384 A | 9/2009 |
| JP | 2010-080756 A | 4/2010 |

* cited by examiner

FIG.15
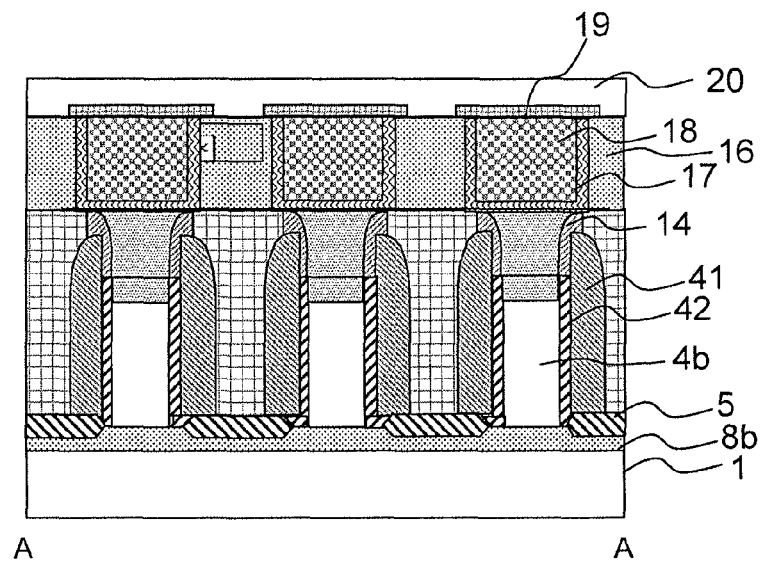
A
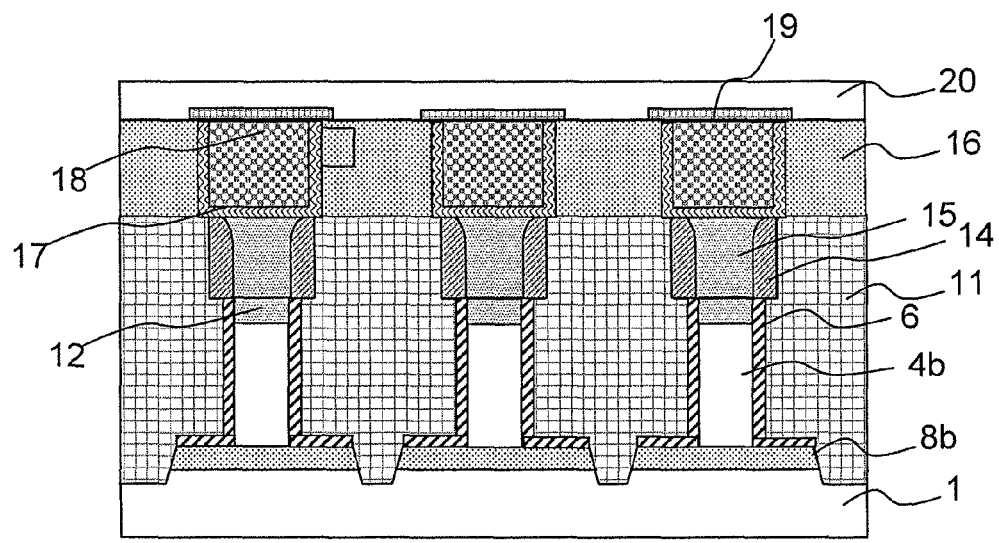
B

FIG.16
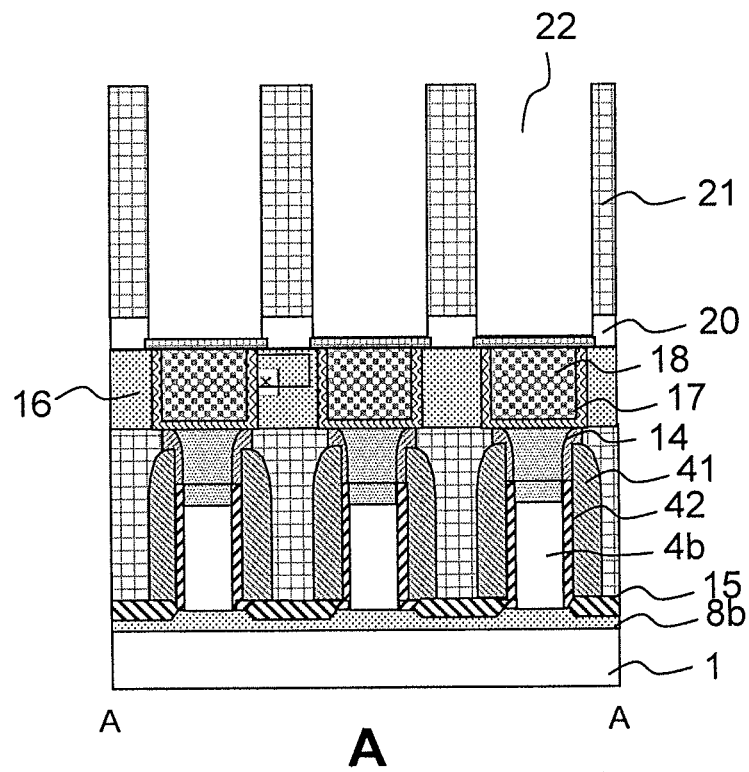
A
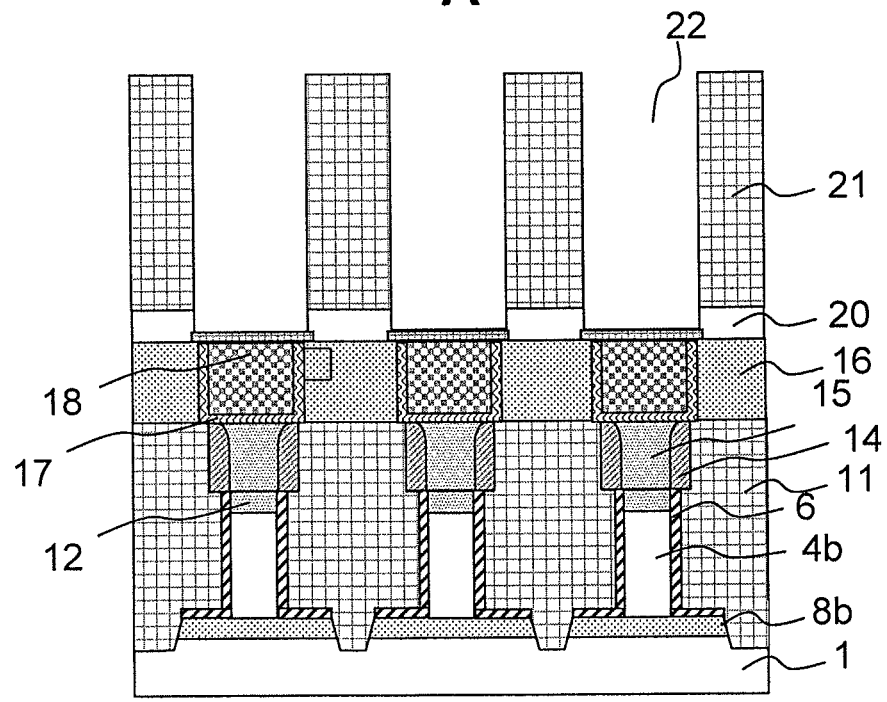
B

FIG.17
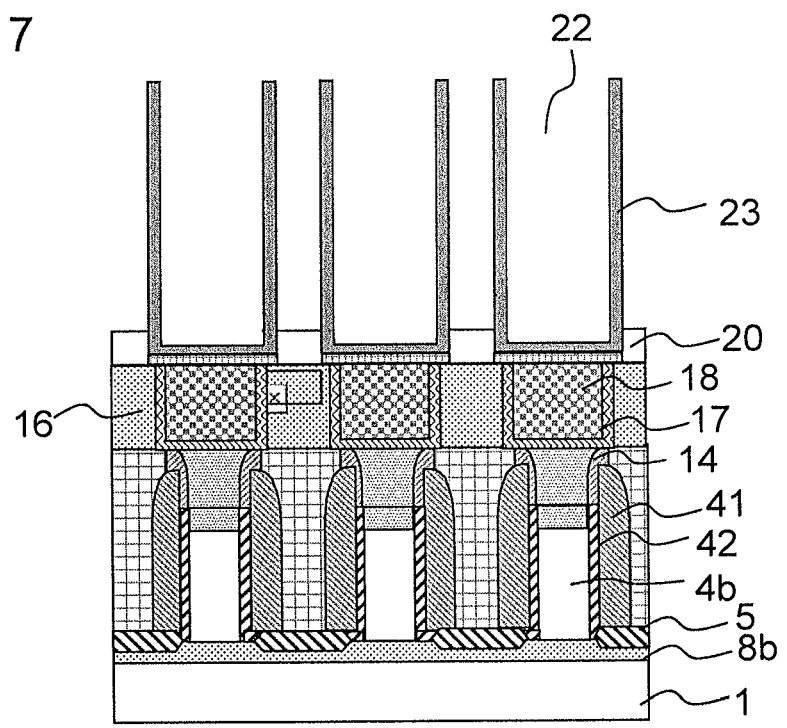
A
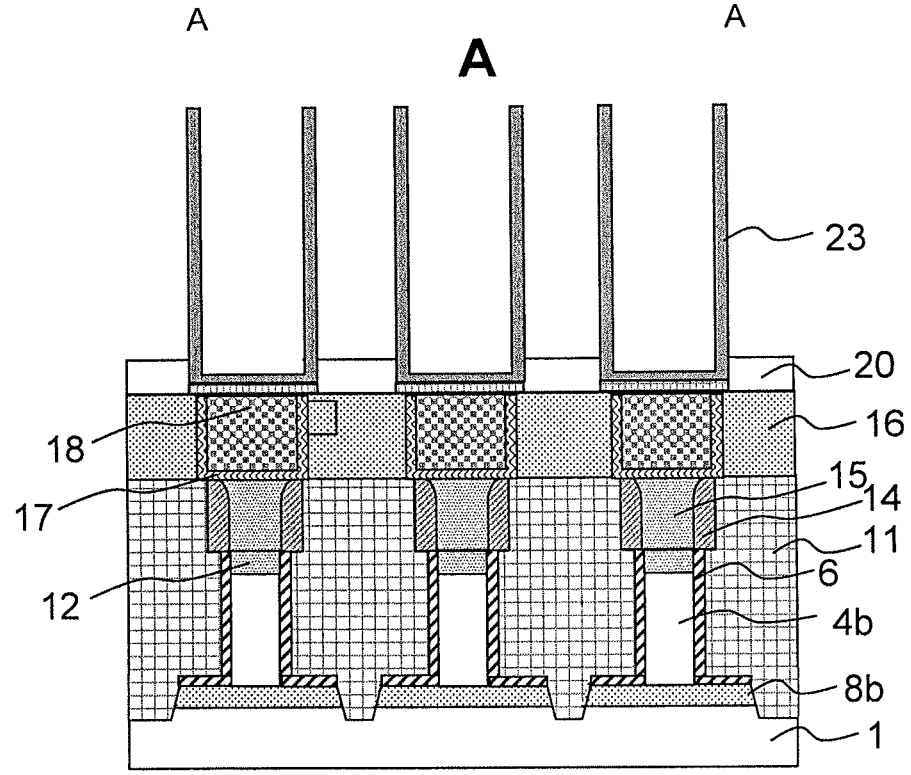
B

METHOD OF MANUFACTURING A PILLAR-TYPE VERTICAL TRANSISTOR

This application is based upon and claims the benefit of priority from Japanese Patent Application No. 2011-158915 filed on Jul. 20, 2011, the disclosure of which are incorporated herein in its entirety by reference.

BACKGROUND OF THE INVENTION

1. Field of the Invention

The present invention relates to a method of manufacturing a device.

2. Description of the Related Art

Conventionally, a pillar-type transistor (vertical transistor) has been used as a transistor having a small occupied area and suited for miniaturization. In this pillar-type transistor, diffusion layers to serve as a source and a drain are formed in the top portion of a pillar and in the semiconductor substrate around the pillar. In addition, a channel is formed between the source and the drain within the pillar.

JP2008-311641A discloses a method of manufacturing this pillar-type transistor. In the method disclosed in JP2008-311641A, a silicon substrate is first processed into a columnar (pillar-like) shape. A bottom diffusion layer is formed in a semiconductor substrate under and lateral to the pillar, a gate electrode is formed over a side surface of the pillar with interposed a gate insulating film therebetween. A top diffusion layer to serve as an LDD region is formed in a top portion of the pillar. Then, silicon is selectively and epitaxially grown on an exposed surface of the top portion of the pillar, in order to further form a top diffusion layer. Thereafter, a high-concentration impurity is introduced into the epitaxially-grown layer by an ion implantation method. The pillar-type transistor is thus formed (see paragraph [0053] and FIGS. 25 and 26).

In the method disclosed in JP2008-311641A, however, the thickness of the epitaxially-grown layer varies in some cases, depending on the growth conditions thereof. In addition, an impurity to be introduced in subsequent ion implantation reaches to the pillar portions (LDD region and channel region) in a thinned portion of the epitaxially-grown layer. This has been a cause for fluctuations or variations in transistor characteristics.

In a pillar-type transistor in particular, the characteristic fluctuations or variations of the transistor have been notable, compared with those of a planar transistor. That is, in the planar transistor, a source and a drain are formed in a substrate, and an epitaxial growth method is not used. Accordingly, the planar transistor has been free from such problems as film thickness fluctuations due to epitaxial growth. In addition, a channel is formed in a direction parallel to the principal surface of the substrate. Accordingly, even if any variations in the ion implantation of an impurity in a depth direction of the substrate occur, the effect of such variations on transistor characteristics has been minor. In contrast, in a pillar-type transistor, a channel is formed in a direction perpendicular to the principal surface of a substrate. Accordingly, any variations in ion implantation have had a major effect on transistor characteristics.

SUMMARY

In one embodiment, there is provided a method of manufacturing a device, comprising:

forming a semiconductor pillar having a first conductivity type protruding from a semiconductor substrate;

forming a bottom diffusion layer having a second conductivity type in the semiconductor substrate around a bottom of the semiconductor pillar;

forming a gate insulator film covering a side surface of the semiconductor pillar;

forming a gate electrode covering the gate insulator film; and forming a top diffusion layer having the second conductivity type at a top portion of the semiconductor pillar, the top diffusion layer including a semiconductor body is formed by an epitaxial growth which contains an impurity.

In another embodiment, there is provided a method of manufacturing a device, comprising:

forming a semiconductor pillar protruding from a semiconductor substrate having a first conductivity type;

forming a bottom diffusion layer having a second conductivity type in the semiconductor substrate around a bottom of the semiconductor pillar;

forming a gate insulator film covering a side surface of the semiconductor pillar;

forming a gate electrode covering the gate insulator film; and forming a top diffusion layer having the second conductivity type at a top portion of the semiconductor pillar.

BRIEF DESCRIPTION OF THE DRAWINGS

FIG. 15 is a cross-sectional view illustrating a semiconductor device manufacturing method of the first exemplary embodiment;

FIG. 16 is a cross-sectional view illustrating a semiconductor device manufacturing method of the first exemplary embodiment;

FIG. 17 is a cross-sectional view illustrating a semiconductor device manufacturing method of the first exemplary embodiment;

DETAILED DESCRIPTION OF THE PREFERRED EMBODIMENTS

Figure 1:
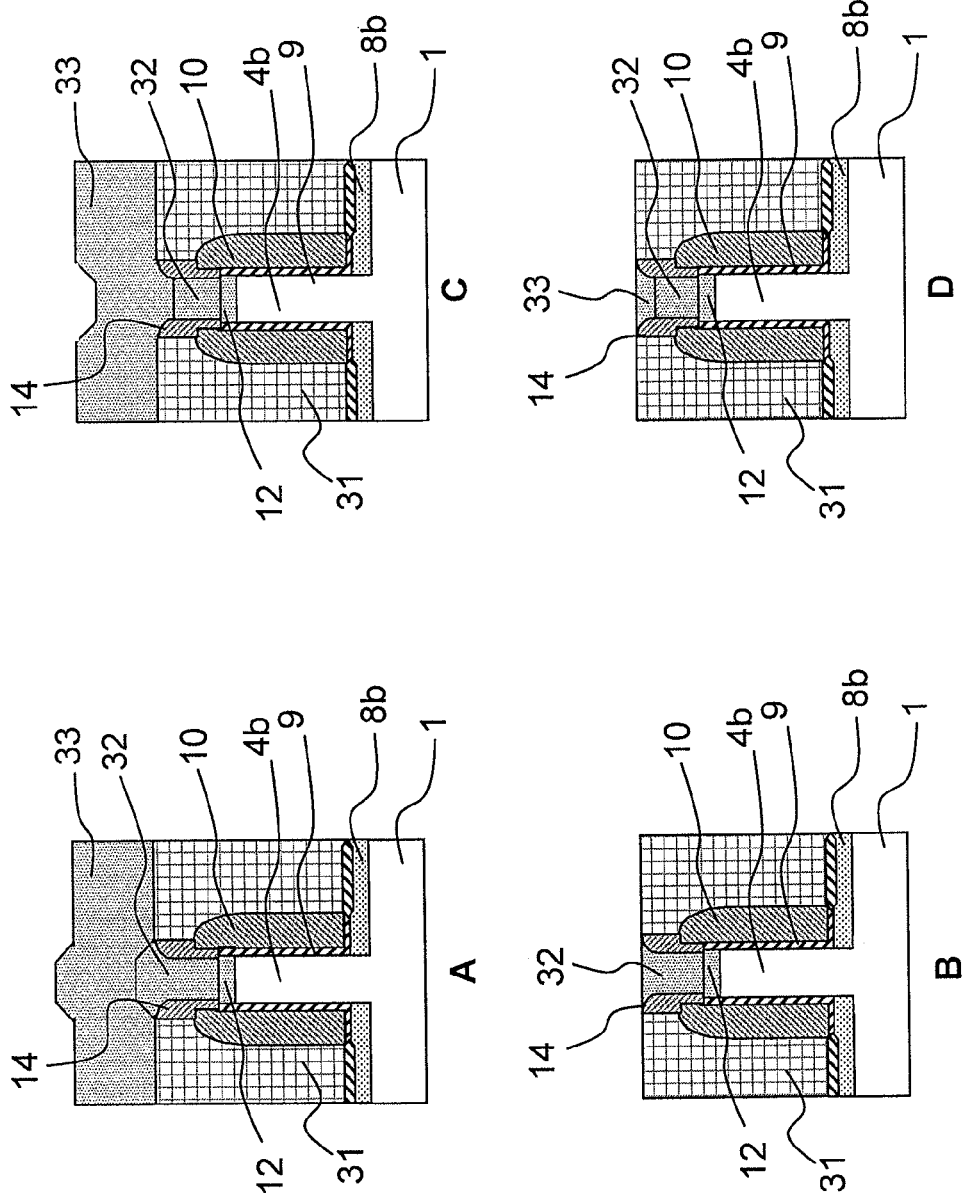
FIG. 1 illustrates the method that the present inventor has studied.

The present inventor has first studied the method illustrated in FIG. 1, in order to solve such problems as film thickness variations and the irregular doping of an impurity into a pillar due to the variations at the time of epitaxial growth. That is, as illustrated in FIG. 1A, semiconductor pillar 4b, gate insulating film 9, gate electrode 10, and bottom diffusion layer 8b are formed. Then, interlayer insulating film 31 is formed on a semiconductor substrate. A hole is formed in interlayer insulating film 31, and then top diffusion layer 12 is formed in a top portion of semiconductor pillar 4b. Sidewall film 14 made of a silicon nitride film is formed on an inner sidewall surface of the hole. Silicon layer 32 is formed by epitaxial growth, so as to protrude above interlayer insulating film 31 from within the hole. Then, silicon layer 33 is further formed by a CVD method or the like on the entire surface of the semiconductor substrate. Next, as illustrated in FIG. 1B, silicon layer 32 is planarized by performing a CMP treatment using sidewall film 14 as a stopper.

In FIG. 1C, silicon layer 32 is formed in basically the same way as in FIG. 1A, except that an upper surface of silicon layer 32 within the hole is lower than a surface of interlayer insulating film 31 at the time of epitaxial growth. Thereafter, silicon layer 33 is further formed by a CVD method or the like on the entire surface of the semiconductor substrate. Next, as illustrated in FIG. 1D, silicon layer 33 is planarized by performing CMP treatment using sidewall film 14 as a stopper.

In the method of FIG. 1, it is possible to reduce a variation in the film thickness of a silicon layer on the pillar. Accordingly, the method is considered to have the effect of suppressing the irregular doping of an impurity into the pillar in subsequent ion implantation. In the method of FIG. 1, however, a silicon deposition step and a CMP treatment step need to be carried out additionally. In addition, a polishing rate at the time of CMP treatment varies in some cases, depending on the in-plane distribution of the pillar.

Hence, the present inventor has accomplished the present invention as a method of preventing the irregular doping of an impurity into a pillar and a variation in transistor characteristics without causing problems ascribable to the method of FIG. 1. That is, in a device manufacturing method of the present invention, a top diffusion layer made of impurity-containing silicon is formed on a semiconductor pillar by epitaxial growth. Consequently, it is possible to omit an ion implantation step for the purpose of introducing an impurity after epitaxial growth. In addition, even if the thickness of an epitaxially-grown layer varies, it is possible to prevent an impurity from being introduced even into a pillar portion to cause a fluctuation in transistor characteristics.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

FIGS. 2 to 17 are cross-sectional views illustrating a semiconductor device manufacturing method of the present exemplary embodiment. In each figure, Drawing A represents a plan view, Drawing B represents a cross-sectional view taken from the A-A direction of Drawing A, and Drawing C represents a cross-sectional view taken from the B-B direction of Drawing A. Also, in FIGS. 15 to 18, only cross-sectional views taken from the A-A and B-B directions are shown without presenting any plan views.

Figure 2:
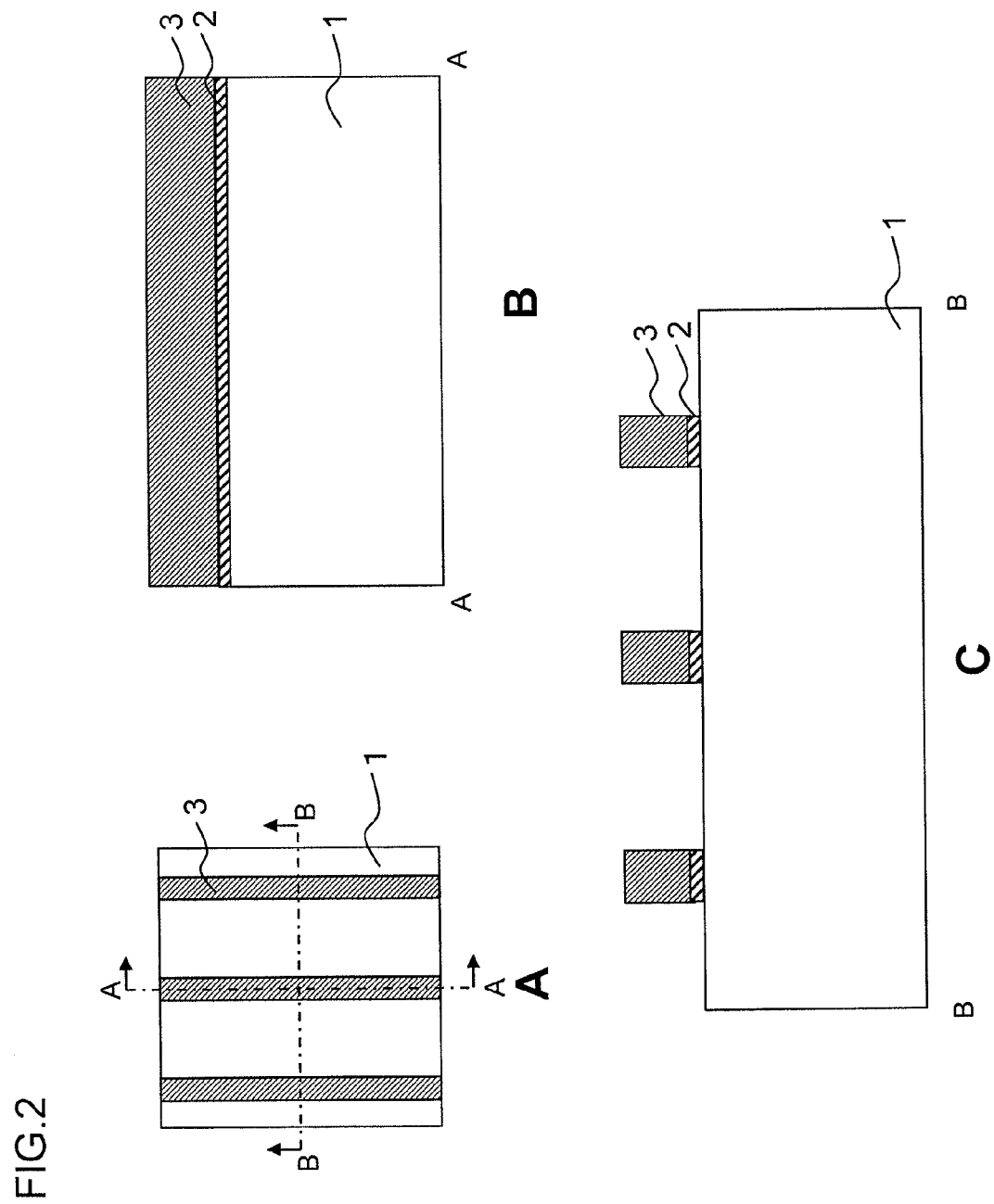
FIG. 2 is a cross-sectional view illustrating a semiconductor device manufacturing method of a first exemplary embodiment.

As illustrated in FIG. 2, silicon oxide film 2 is formed by oxidizing a surface of silicon semiconductor substrate 1 having a first conductivity type. Silicon nitride film 3 is formed on silicon oxide film 2 by a CVD method. Silicon nitride film 3 and silicon oxide film 2 are patterned to form a hard mask made of silicon nitride film 3 on semiconductor substrate 1.

Figure 3:
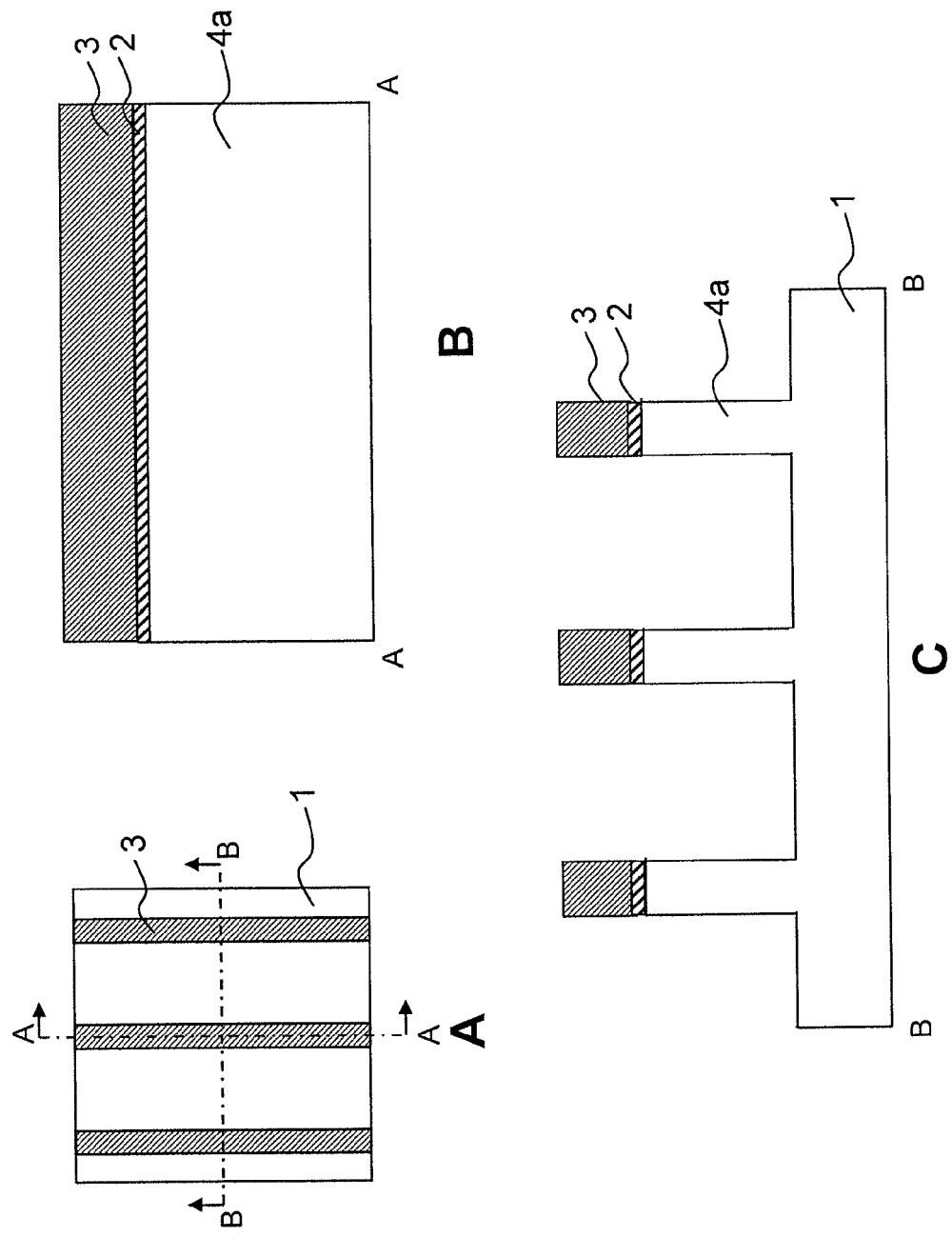
FIG. 3 is a cross-sectional view illustrating a semiconductor device manufacturing method of the first exemplary embodiment.

As illustrated in FIG. 3, semiconductor substrate 1 is etched down by dry etching using the patterned hard mask. Consequently, there is formed fin 4a protruding from a principal surface of the silicon substrate in a direction perpendicular to the principal surface and extending in the A-A direction.

Figure 4:
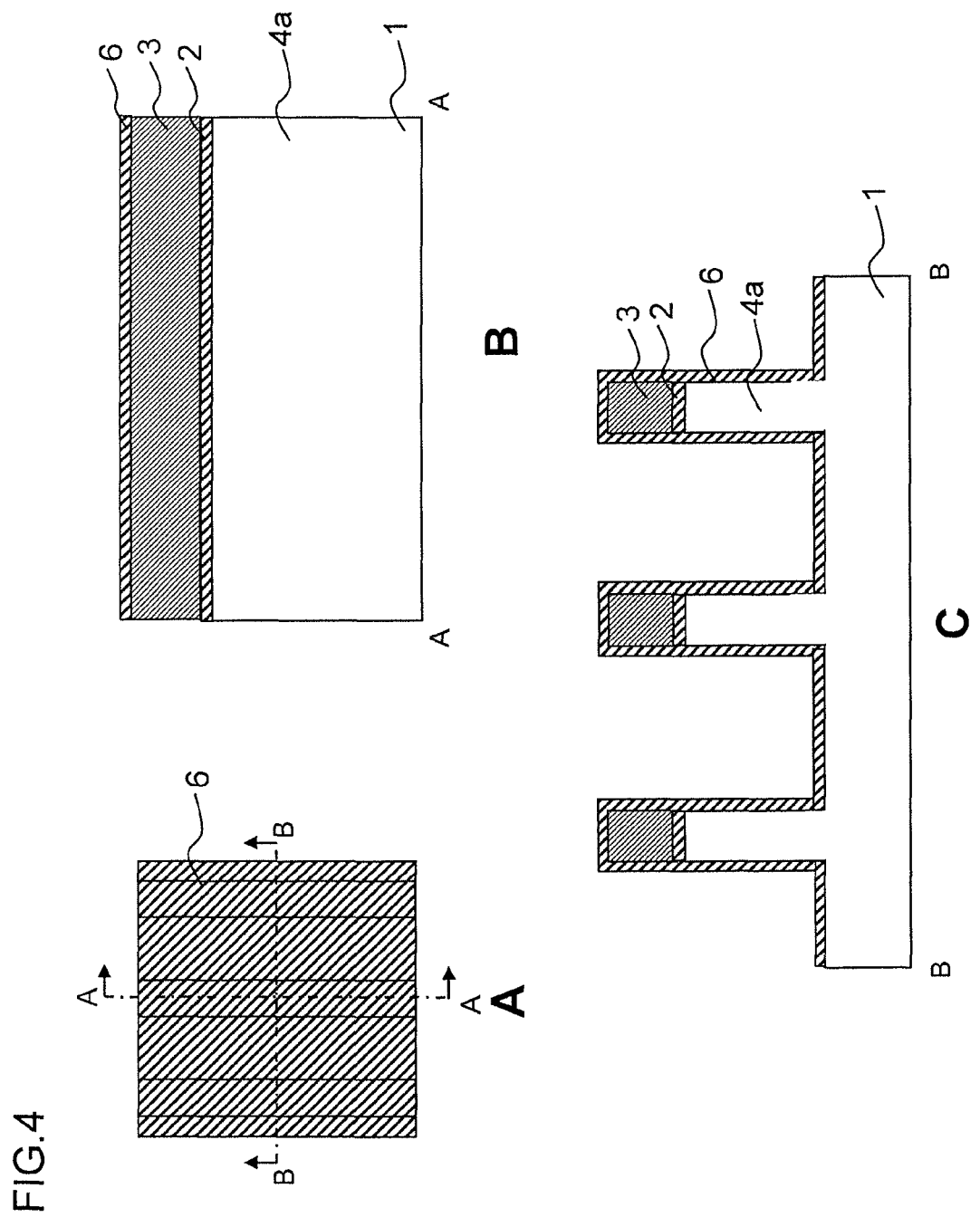
FIG. 4 is a cross-sectional view illustrating a semiconductor device manufacturing method of the first exemplary embodiment.

As illustrated in FIG. 4, silicon oxide film 6 is formed by thermally oxidizing surfaces of the semiconductor substrate, fin and the like.

Figure 5:
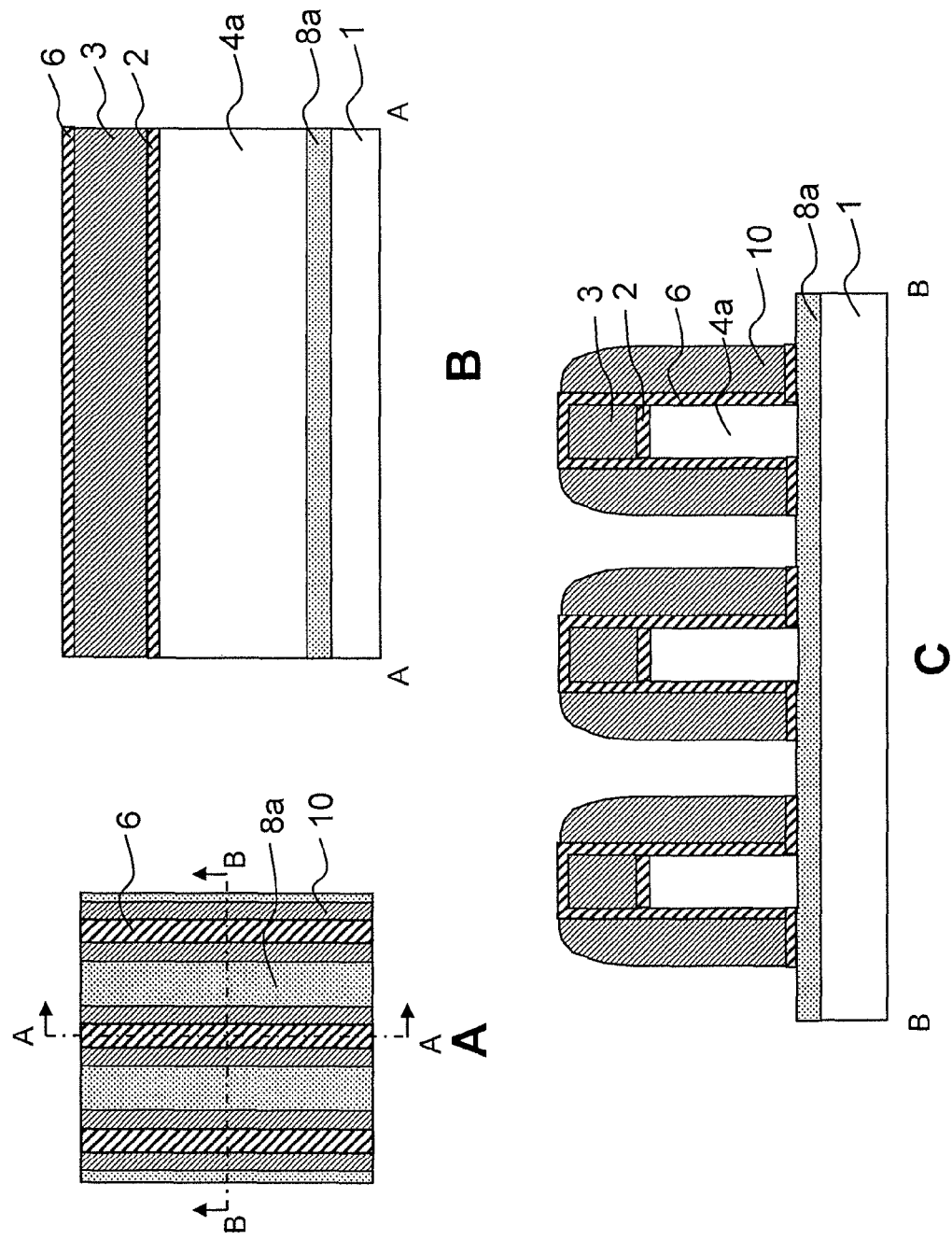
FIG. 5 is a cross-sectional view illustrating a semiconductor device manufacturing method of the first exemplary embodiment.

As illustrated in FIG. 5, a silicon nitride film is formed on the entire surface of the semiconductor substrate and then etched back. Consequently, sidewall 10 is formed on a side surface of fin 4a. Exposed portions of silicon oxide film 6 are removed. In addition, an impurity having a second conductivity type is ion-implanted into the semiconductor substrate and then activated by annealing to form impurity-diffused layer 8a.

Figure 6:
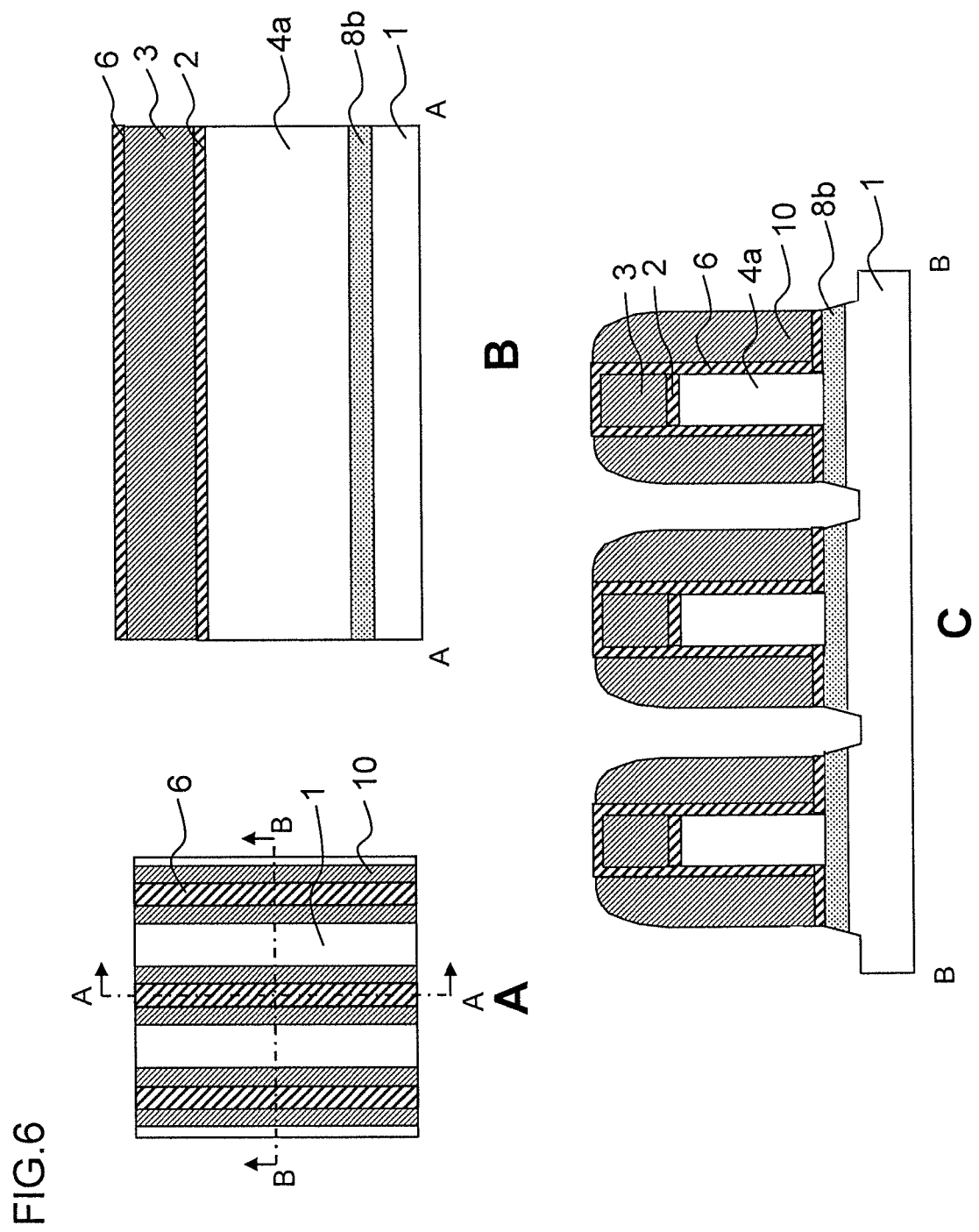
FIG. 6 is a cross-sectional view illustrating a semiconductor device manufacturing method of the first exemplary embodiment.

As illustrated in FIG. 6, semiconductor substrate 1 is etched using silicon oxide film 6 and sidewall 10 as a mask. Consequently, impurity-diffused layer 8a formed in the step of FIG. 5 is divided, thus forming a plurality of embedded bit lines 8b extending in the A-A direction. In each of these embedded bit lines 8b, a lower region of semiconductor pillar to be formed later also functions as a bottom diffusion layer.

Figure 7:
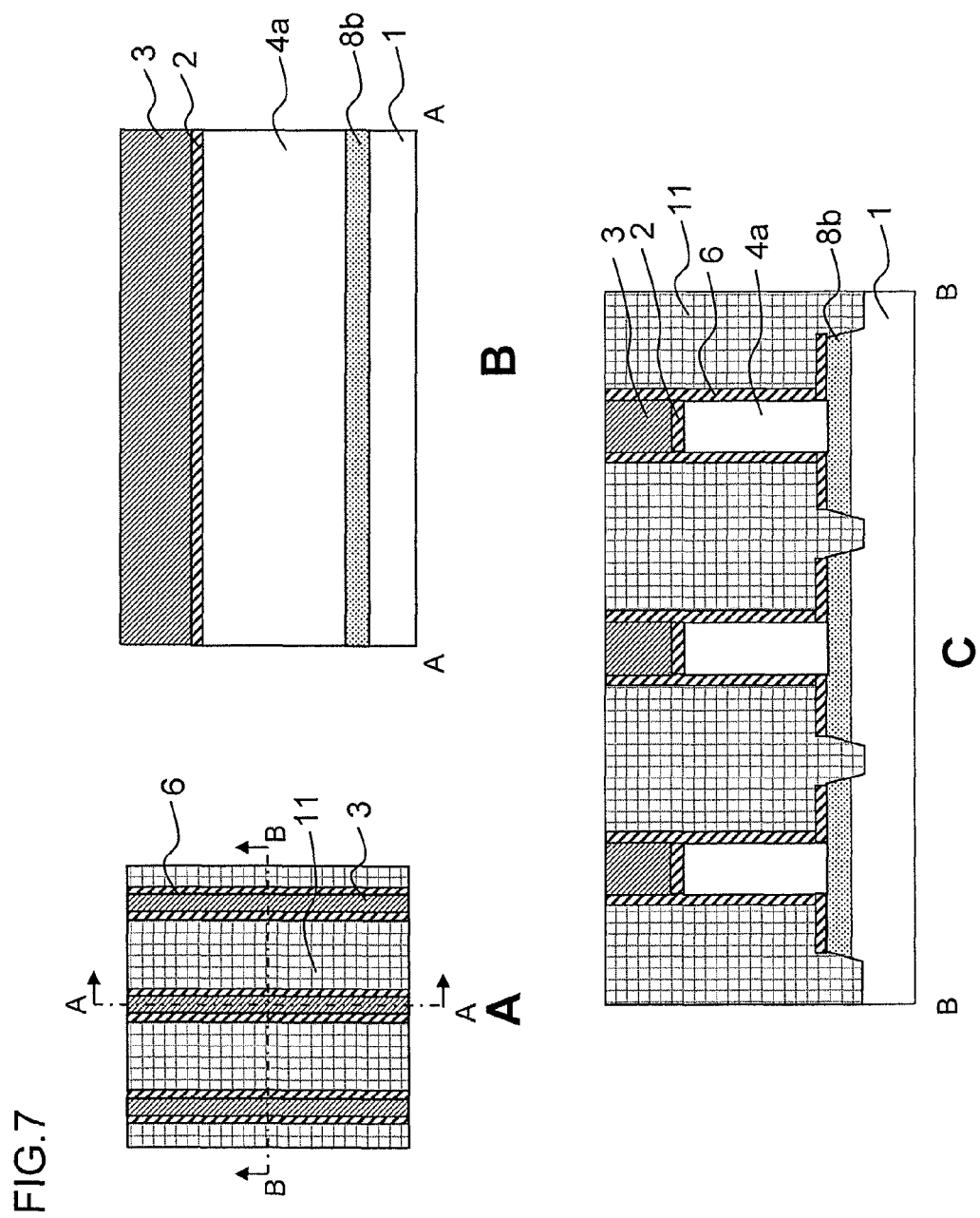
FIG. 7 is a cross-sectional view illustrating a semiconductor device manufacturing method of the first exemplary embodiment.

As illustrated in FIG. 7, part of first interlayer insulating film 11 made of a silicon oxide film is formed on the entire surface of the semiconductor substrate after sidewall 10 is removed. Using silicon nitride film 3 as a stopper, a CMP treatment is performed on first interlayer insulating film 11.

Figure 8:
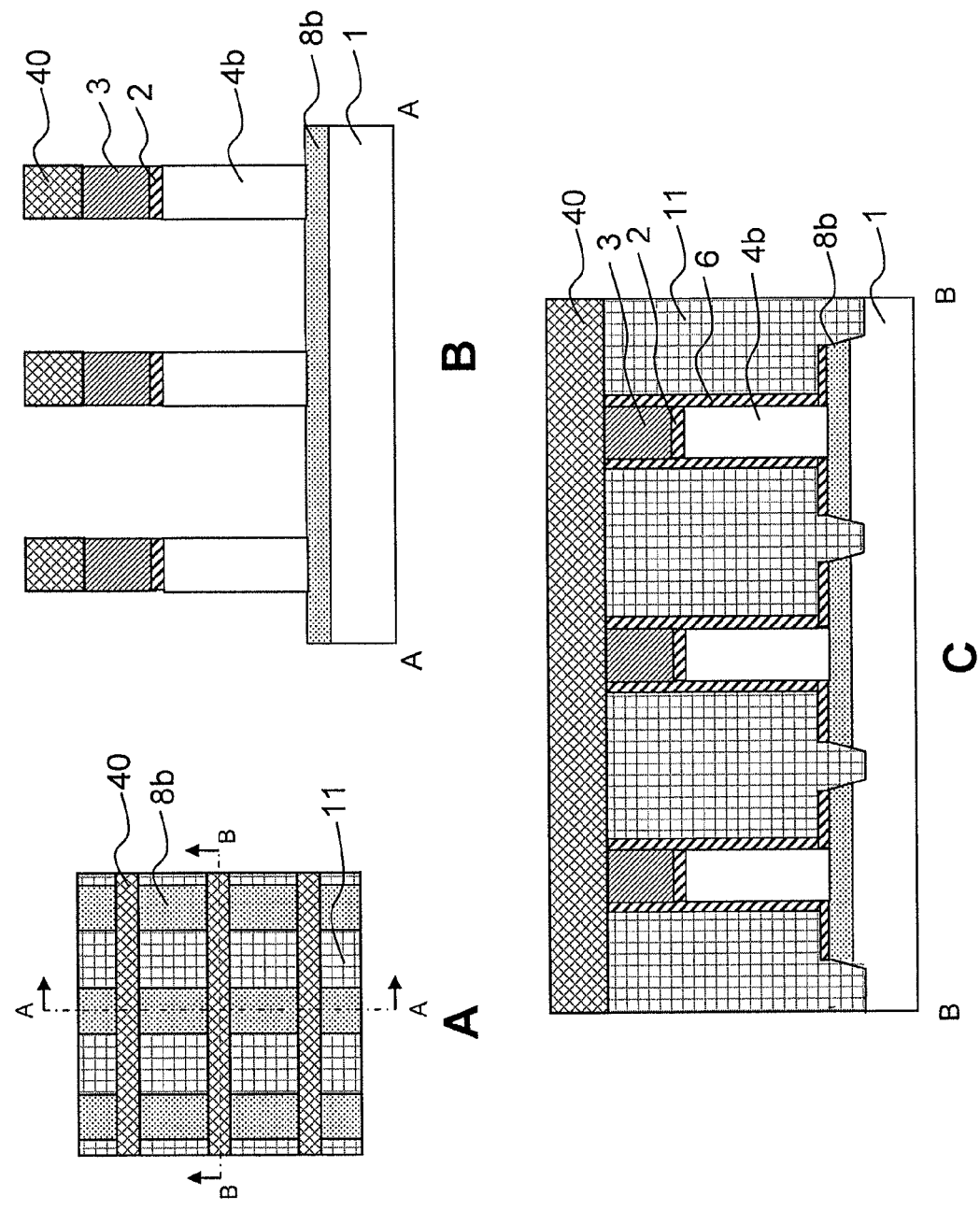
FIG. 8 is a cross-sectional view illustrating a semiconductor device manufacturing method of the first exemplary embodiment.

As illustrated in FIG. 8, there is formed a plurality of photoresist patterns 40 extending in the B-B direction. Using photoresist patterns 40 as a mask, fin 4a is etched to form semiconductor pillar 4b. In the present exemplary embodiment, respective semiconductor pillars 4b are the same in cross-sectional shape and pillar diameter. In addition, the plurality of semiconductor pillars 4b is regularly disposed in two directions orthogonal to each other, thereby forming arrays. Each embedded bit line 8b positioned underneath each semiconductor pillar also functions as a bottom diffusion layer.

Figure 9:
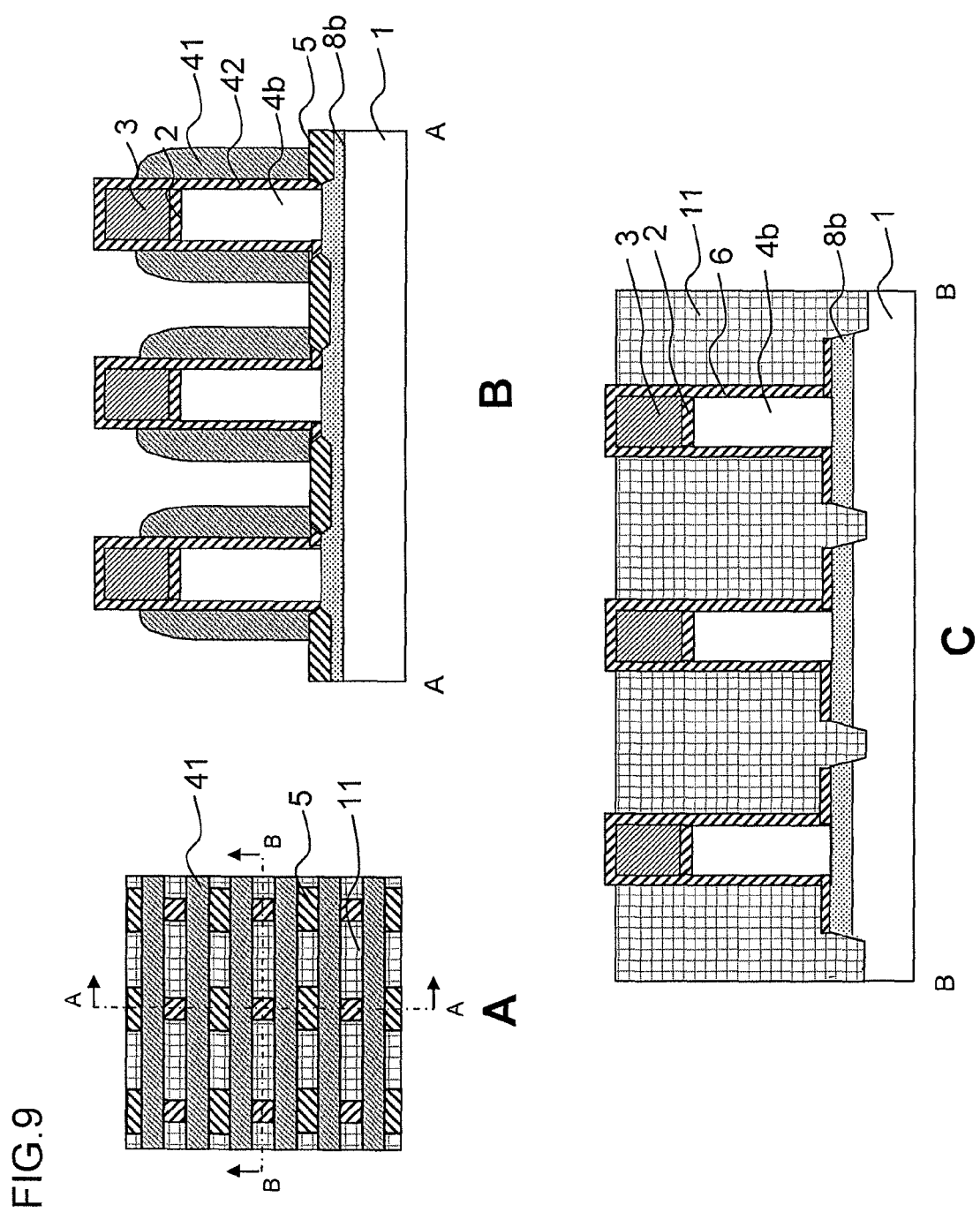
FIG. 9 is a cross-sectional view illustrating a semiconductor device manufacturing method of the first exemplary embodiment.

As illustrated in FIG. 9, surfaces of semiconductor pillars 4b are oxidized after photoresist patterns 40 are removed, thereby forming a protective film (not illustrated). A silicon nitride film (not illustrated) is formed on the semiconductor substrate and then etched back to form a sidewall on a side surface of each semiconductor pillar 4b. A surface of the semiconductor substrate is thermally oxidized to form isolation region 5. Sidewalls of the silicon nitride film and a portion of the protective film on the surface of each semiconductor pillar 4b are removed. Using an ISSG (In-Situ Steam Generation) process, gate insulating film 42 is formed on an exposed side surface of each semiconductor pillar 4b. An in-situ doped polysilicon film is formed on the entire surface of the semiconductor substrate and then etched back to form gate electrode 41 on a side surface of each semiconductor pillar 4b.

Figure 10:
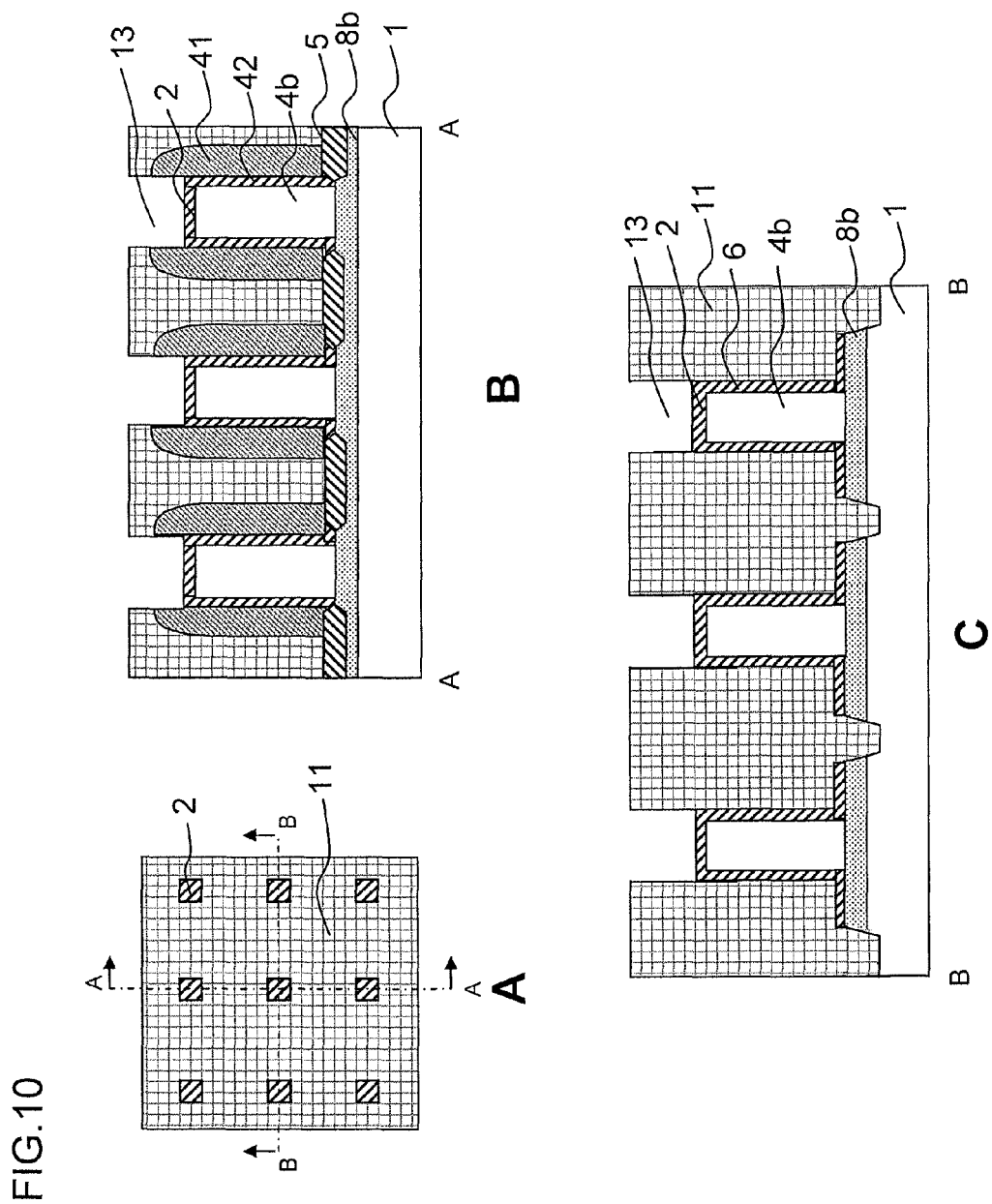
FIG. 10 is a cross-sectional view illustrating a semiconductor device manufacturing method of the first exemplary embodiment.

As illustrated in FIG. 10, part of first interlayer insulating film 11 made of a silicon oxide film is formed on the entire surface of the semiconductor substrate. Thereafter, using silicon nitride film 3 as a stopper, a surface of first interlayer insulating film 11 is polished and planarized by a CMP method. Silicon nitride film 3 is removed, and hole 13 is formed in first interlayer insulating film 11, so as to expose silicon oxide film 2 which is part of a hard mask.

Figure 11:
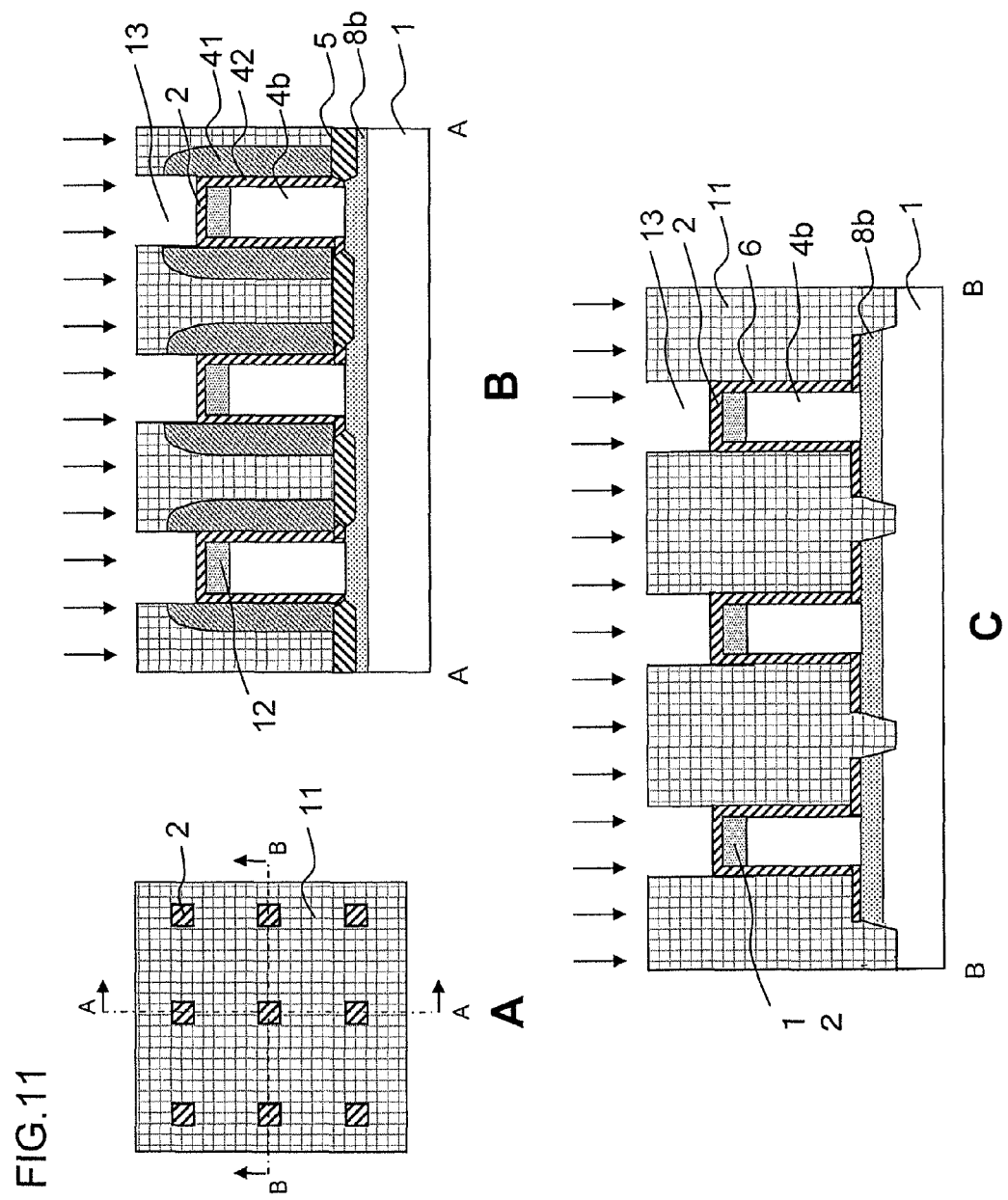
FIG. 11 is a cross-sectional view illustrating a semiconductor device manufacturing method of the first exemplary embodiment.

As illustrated in FIG. 11, a low-concentration impurity having a second conductivity type opposite to that of an impurity having a first conductivity type within the silicon substrate is shallowly ion-implanting into a top portion of semiconductor pillar 4b, thereby forming LDD (Lightly Doped Drain) region 12.

Figure 12:
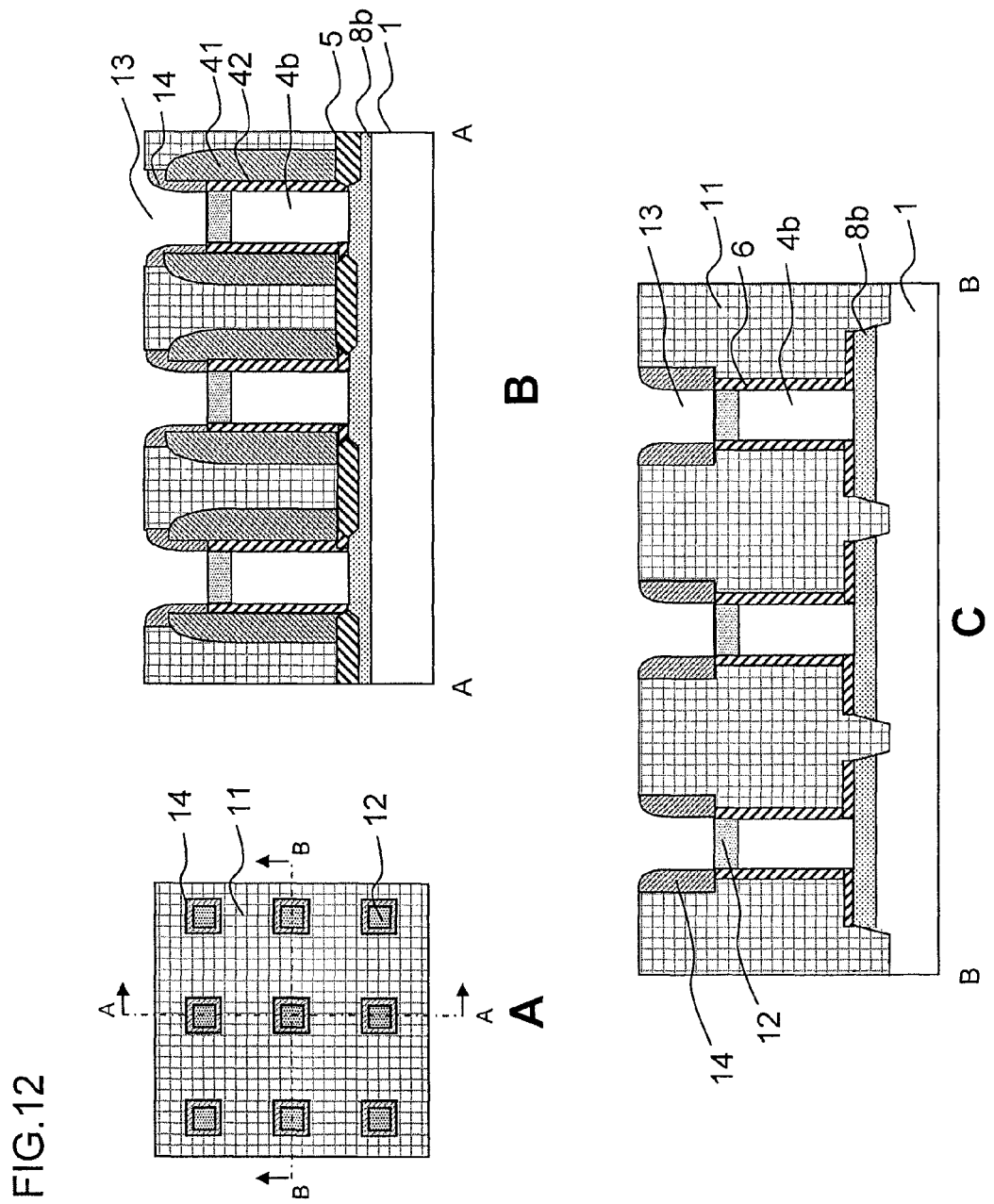
FIG. 12 is a cross-sectional view illustrating a semiconductor device manufacturing method of the first exemplary embodiment.

As illustrated in FIG. 12, silicon oxide film 2 which is part of the hard mask is removed. At this time, first interlayer insulating film 11 is also removed slightly, and therefore, hole 13 becomes larger in diameter. A silicon nitride film is formed on the entire inner surface of hole 13 and then etch backed to form sidewall film 14 on an inner sidewall surface of hole 13.

Figure 13:
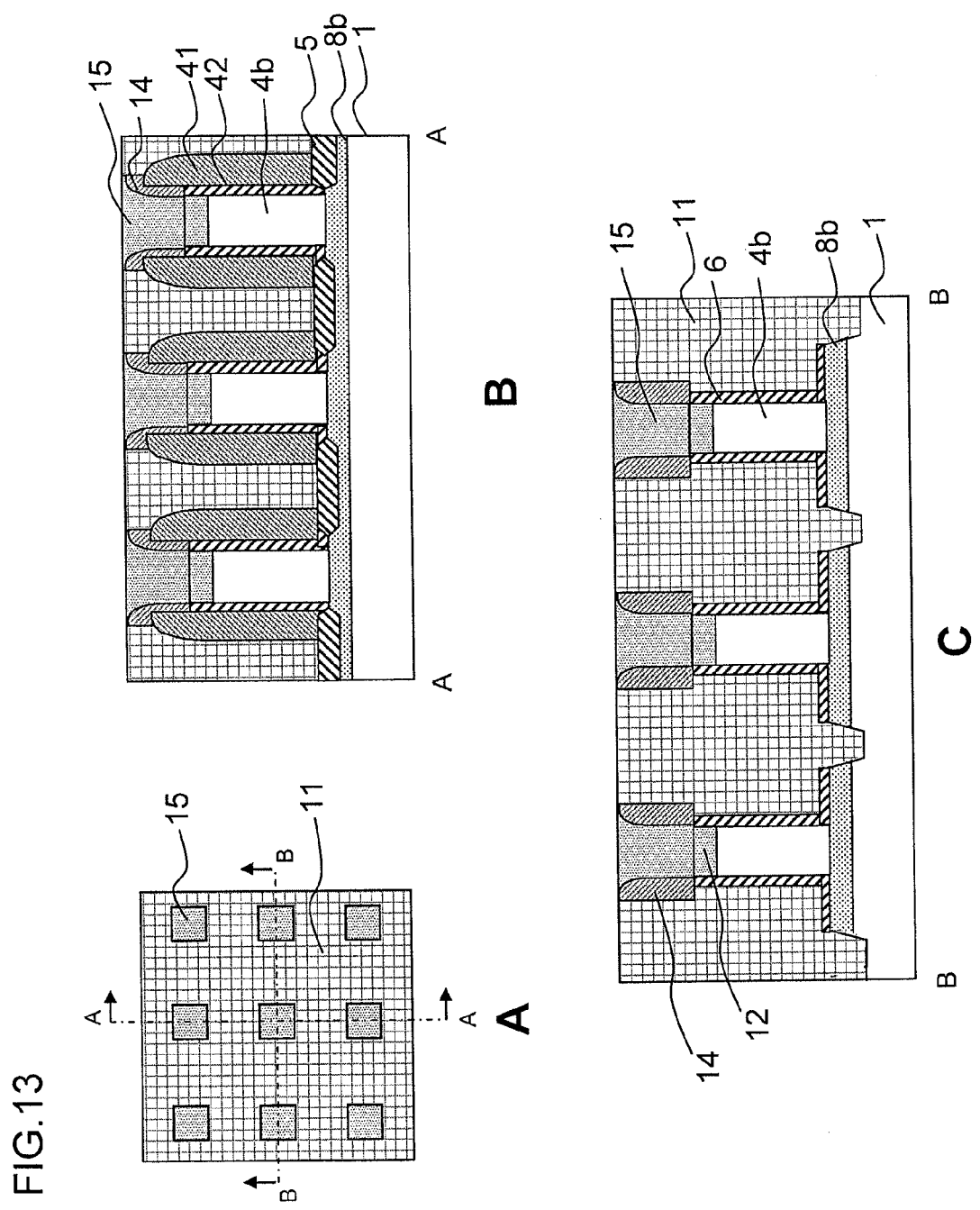
FIG. 13 is a cross-sectional view illustrating a semiconductor device manufacturing method of the first exemplary embodiment.

As illustrated in FIG. 13, impurity-containing silicon is epitaxially grown on an upper surface of each semiconductor pillar 4b to form silicon layer 15 opposite in conductivity type to the semiconductor pillar. At this time, an impurity concentration within silicon layer 15 is set to $1.0 \times 10^{19}$ to $10 \times 10^{20}/cm^3$, so as to be higher than that of the LDD region. Thereafter, using sidewall film 14 as a stopper, silicon layer 15 is CMP-treated and planarized to form top diffusion layer 15. Top diffusion layer 15 functions as the other one of a source and a drain. Since silicon layer 15 is formed within hole 13, top diffusion layer 15 is formed in a self-aligned manner with respect to semiconductor pillar 4b.

Figure 14:
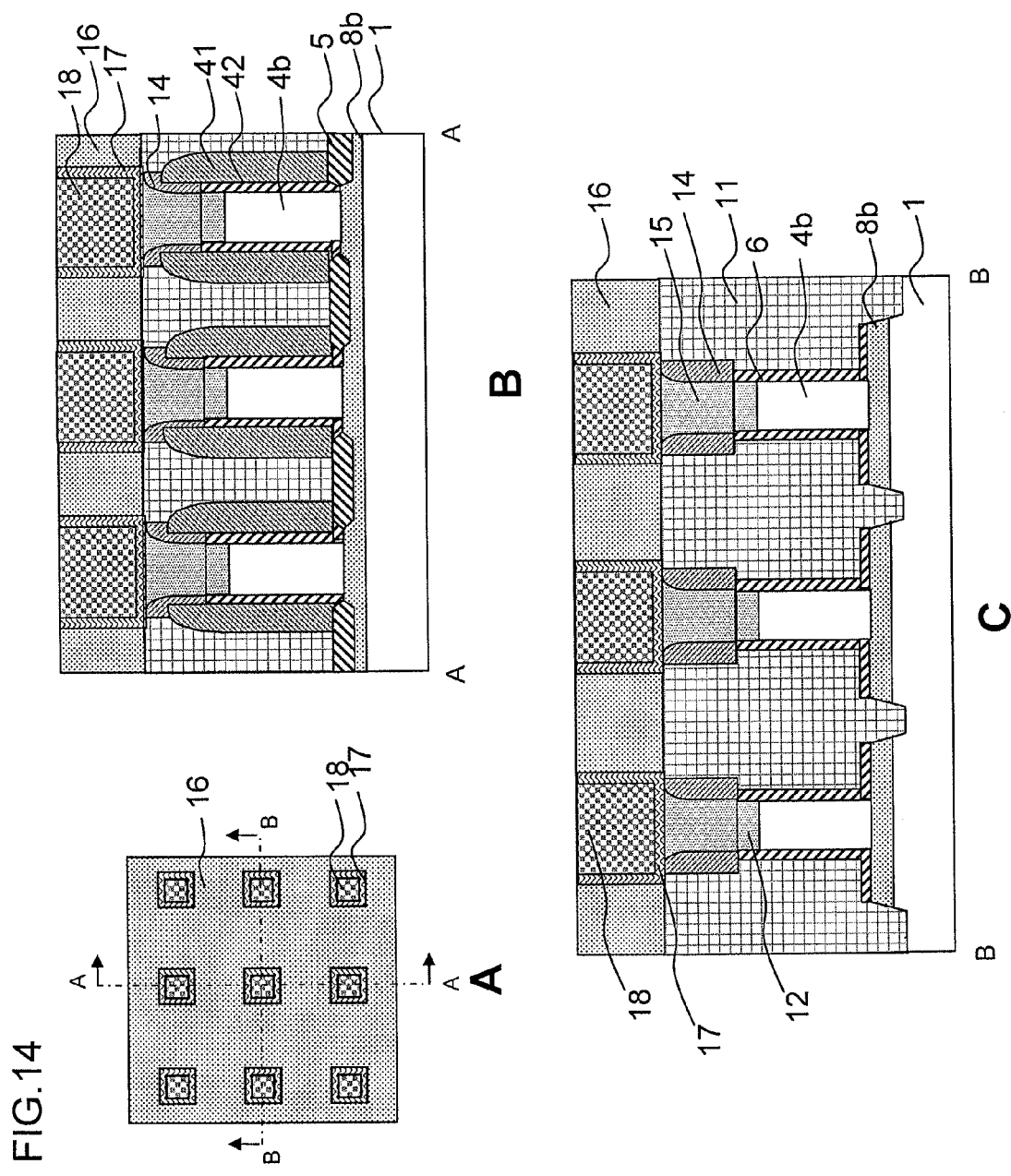
FIG. 14 is a cross-sectional view illustrating a semiconductor device manufacturing method of the first exemplary embodiment.

As illustrated in FIG. 14, second interlayer insulating film 16 made of a silicon oxide film is formed on first interlayer insulating film 11 by a CVD method, and then a contact hole is formed within second interlayer insulating film 16. Barrier film (TiN/Ti) 17 made of a laminated film of titanium and titanium nitride and metal film 18 made of tungsten or the like are formed on an inner wall of the contact hole to form a contact plug.

As illustrated in FIG. 15, capacitor contact pad 19 is formed on second interlayer insulating film 16. Next, third interlayer insulating film 20 made of a silicon nitride film is formed on second interlayer insulating film 16 by a CVD method. Thereafter, third interlayer insulating film 20 is planarized by a CMP treatment.

As illustrated in FIG. 16, fourth interlayer insulating film 21 made of a silicon oxide film is formed on third interlayer insulating film 20 by a CVD method. Thereafter, capacitor hole 22 is formed within fourth interlayer insulating film 21.

As illustrated in FIG. 17, lower electrode 23 is formed on an inner wall of capacitor hole 22 by an ALD (Atomic Layer Deposition) method or the like. Thereafter, fourth interlayer insulating film 21 is removed.

Figure 18:
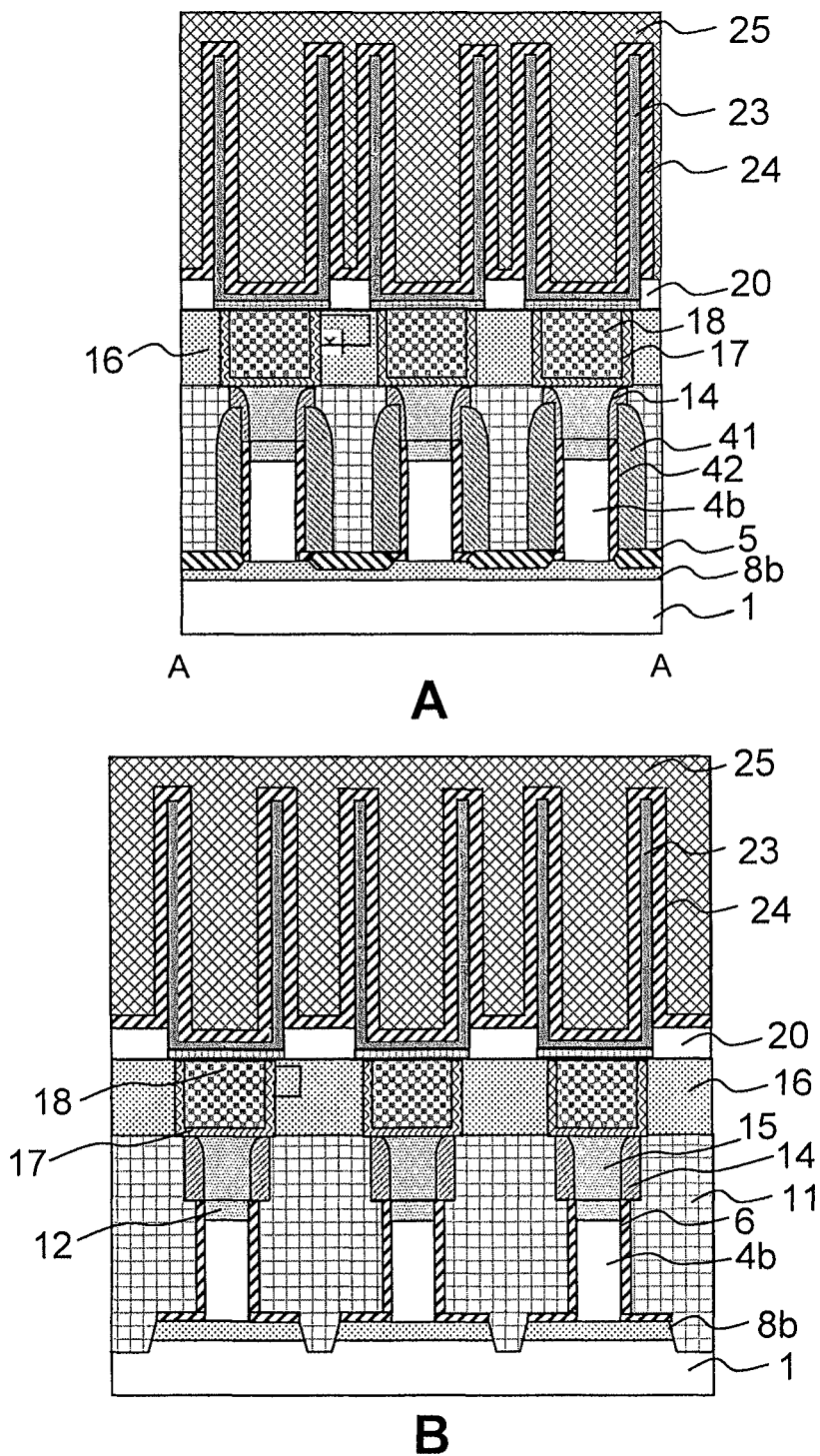
FIG. 18 corresponds to a cross-sectional view taken from the A-A' direction of FIG. 19.

As illustrated in FIG. 18, capacitor insulating film 24 is formed on a surface of lower electrode 23 by a CVD method or the like. Thereafter, upper electrode 25 is formed so as to fill the interiors of capacitor holes 22 and spaces thereamong. Consequently, there is formed a capacitor including lower electrode 23, capacitor insulating film 24, and upper electrode 25. The capacitor (storage element) is electrically connected to the top diffusion layer with interposed the capacitor contact pad and the contact plug therebetween. A semiconductor device provided with a DRAM (Dynamic Random Access Memory) including capacitors, transistors and bit lines is thus completed.

Figure 19:
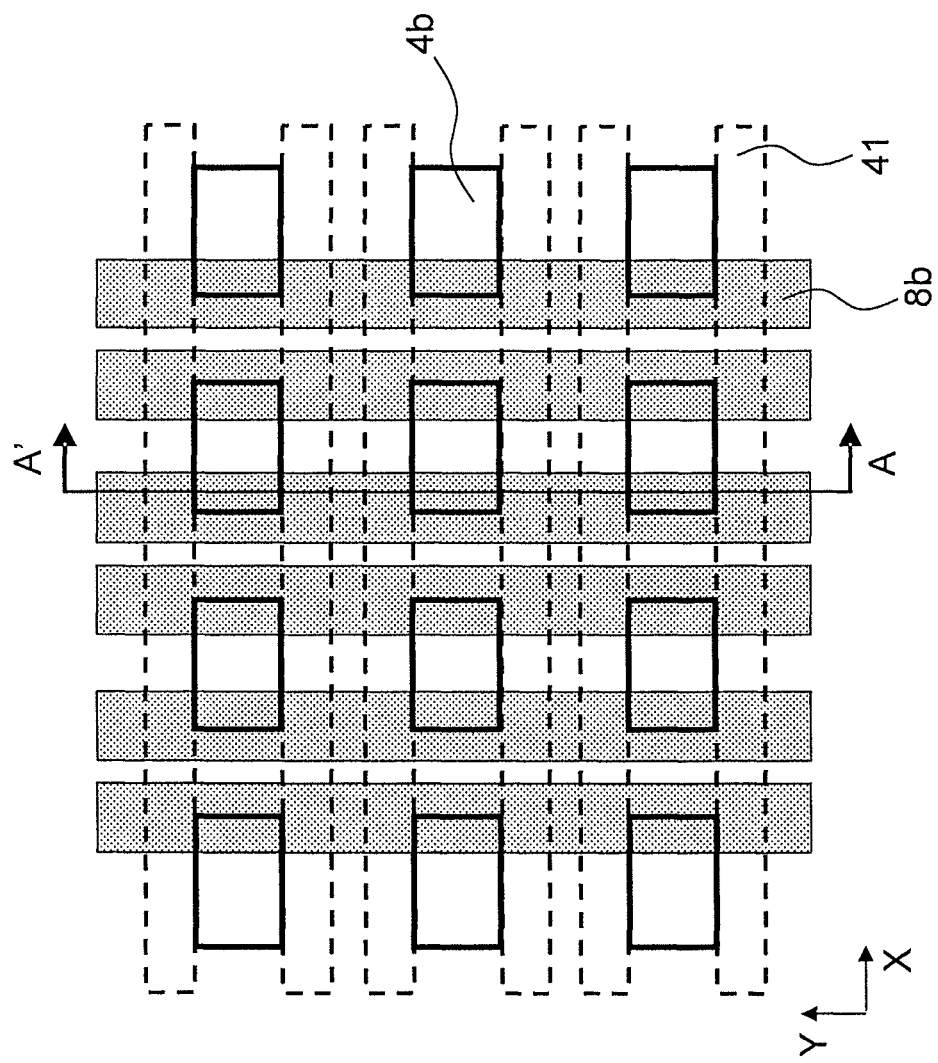
FIG. 19 represents a schematic view of the semiconductor device of the first exemplary embodiment taken from an upper surface of a semiconductor device.

FIG. 19 represents a schematic view of the semiconductor device of the present exemplary embodiment taken from an upper surface of the semiconductor device. FIG. 18 corresponds to a cross-sectional view taken from the A-A' direction of FIG. 19. As illustrated in FIG. 19, a plurality of semiconductor pillars 4b having a rectangular cross-sectional shape and the same pillar diameter are regularly disposed in X and Y directions, thus forming arrays. Gate electrodes 42 are formed on mutually-opposed two side surfaces of each semiconductor pillar 4b with interposed a gate insulating film (not illustrated) therebetween. Each gate electrode 42 extends in the X direction and provided in common to the plurality of semiconductor pillars 4b, so as to function as a word line. Each embedded bit line 8b is provided so as to be electrically connected to the bottom diffusion layer of each semiconductor pillar 4b. Each embedded bit line 8b extends in the Y direction.

In the present exemplary embodiment, semiconductor pillar composing each transistor are the same in shape and pillar diameter. This is effective in applying the semiconductor pillars to a method of manufacturing a device including a plurality of pillar-type transistors having the same characteristics. That is, there is, for example, a memory cell array circuit as a circuit including a plurality of transistors the same in shape (pillar diameter, in particular) and characteristics and formed by a common process. Selective transistors of the memory cell array circuit (for example, selective transistors of a 4F2 memory cell) are desired to be small in the variation of transistor characteristics.

In the case of a process of forming pillar-type transistors, however, variations occur in a step of pillar formation or a step of silicon nitride film sidewall formation, thus causing the area of an upper surface of each pillar to vary. Since the upper surface of each pillar serves as a foundation of epitaxial growth at the time of forming a top diffusion layer, such area variations cause a difference in the rate of epitaxial growth. In general, if epitaxial growth is performed on foundations different in area in the same process, the progress of epitaxial growth is slower as the area of a foundation decreases. Thus, the rate of growth becomes lower. In a method of introducing an impurity by ion implantation after epitaxial growth, irregular impurity doping may occur in an underlying LDD region or channel region due to the implantation of the impurity into a thinned-down epitaxial layer.

In the present exemplary embodiment, however, an impurity is introduced into the silicon layer during epitaxial growth, and therefore, ion implantation is not required in later steps. Accordingly, irregular impurity doping into the LDD region or the channel region does not occur even if the epitaxially-grown layer becomes thinner due to process variations. As a result, it is possible to reduce a characteristic variation among memory cell transistors.

The present exemplary embodiment is applicable no matter whether n-channel transistors or p-channel transistors are manufactured. When n-channel transistors are manufactured, a semiconductor substrate into which an impurity element of p-conductivity type (first conductivity type) has been introduced is prepared, and an impurity element of n-conductivity type (second conductivity type) is introduced into bottom and top diffusion layers and an LDD region as an impurity of an opposite conductivity type. When p-channel transistors are manufactured, a semiconductor substrate into which an impurity element of n-conductivity type (first conductivity type) has been introduced is prepared, and an impurity element of p-conductivity type (second conductivity type) is introduced into bottom and top diffusion layers and an LDD region as an impurity of an opposite conductivity type.

Second Exemplary Embodiment

The present exemplary embodiment differs from the first exemplary embodiment in that the semiconductor device is provided with two or more types of semiconductor pillars different in pillar diameter. A manufacturing process of the present exemplary embodiment is the same as that of the first exemplary embodiment, except that two or more types of semiconductor pillars different in pillar diameter are formed in the semiconductor pillar formation step of the first exemplary embodiment (FIG. 3). Accordingly, a manufacturing method of the present exemplary embodiment will not be described here.

Figure 20:
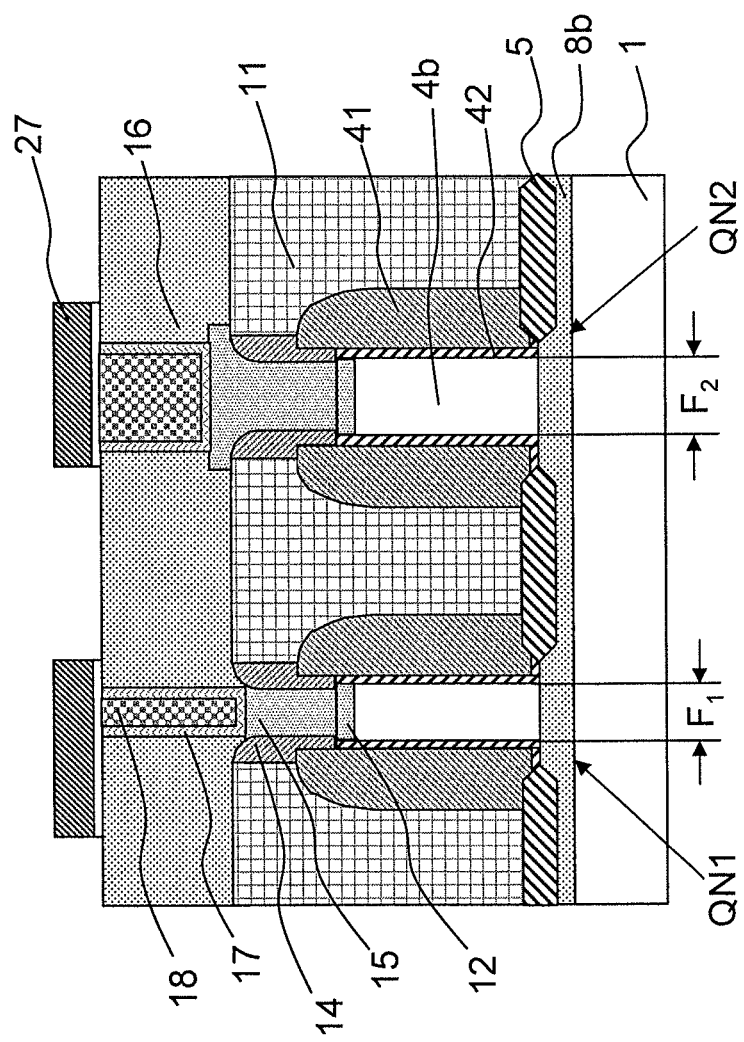
FIG. 20 is a schematic view used to describe a semiconductor device of a second exemplary embodiment.

FIG. 20 is a schematic view used to describe a semiconductor device of the present exemplary embodiment. As illustrated in FIG. 20, pillar diameter $F_1$ of transistor QN1 is smaller than pillar diameter $F_2$ of transistor QN2. In a general circuit, characteristics required of each transistor differ depending on the application thereof. Thus, even transistor of the same channel conductivity type differs in channel length and/or channel width. Although being the same channel-type transistors, pillar-type transistors differ in desired pillar diameter, depending on required characteristics (for example, threshold voltage and drive current).

In the case of FIG. 20, the upper areas of pillars serving as foundations for the selective epitaxial growth of silicon are in the same magnitude relationship as the pillar diameters of the pillars. In general, if epitaxial growth is performed on foundations different in area in the same process, the progress of epitaxial growth becomes slower as the foundation area decreases. Accordingly, the film thickness of an epitaxially-grown layer tends to result in the relationship "T1 (film thickness of the epitaxially-grown layer on a first semiconductor pillar of QN1)<T2 (film thickness of the epitaxially-grown layer on a second semiconductor pillar of QN2)". In a method of introducing an impurity by ion implantation after epitaxial growth, irregular impurity doping may occur in an underlying LDD region or channel region due to the implantation of the impurity into a thin epitaxial layer.

In the present exemplary embodiment, however, an impurity is introduced into the silicon layer during epitaxial growth, and therefore, ion implantation is not required in later steps. Accordingly, irregular impurity doping into the LDD region or the channel region does not occur, though film thickness T1 of a silicon layer of QN1 may become thinner than film thickness T2 of a silicon layer of QN2. As a result, it is possible to reduce fluctuations from intended transistor characteristics.

In the present exemplary embodiment, impurity concentrations in the first to fourth diffusion layers and the LDD region may be either the same or different from one another among transistors different in pillar diameter. If impurity concentrations in the first to fourth diffusion layers and the LDD region need to be equalized in all transistors, an impurity may be ion-implanted in the same way as in the first exemplary embodiment.

If impurity concentrations in the first to fourth diffusion layers and the LDD region need to be differentiated from one another among transistors different in pillar diameter, the transistors may be manufactured by, for example, the below-described method.

Instead of the step of FIG. 4 in the first exemplary embodiment, a first mask is provided so as to cover a region for forming a first transistor. Then, a second diffusion layer having a desired impurity concentration is formed within a portion of a substrate underneath a second semiconductor pillar for a second transistor by the ion implantation of an impurity. Thereafter, the first mask is removed, and then a second mask is provided so as to cover a region for forming the second transistor. Then, a first diffusion layer having a desired impurity concentration is formed within a portion of the substrate underneath a first semiconductor pillar for the first transistor by the ion implantation of an impurity. Thereafter, the second mask is removed.

Instead of the step of FIG. 11 in the first exemplary embodiment, a third mask is provided so as to cover the region for forming the first transistor. Then, an LDD region having a desired impurity concentration is formed in a top portion of the second semiconductor pillar for the second transistor by the ion implantation of an impurity. Thereafter, the third mask is removed, and then a fourth mask is provided so as to cover the region for forming the second transistor. Then, an LDD region having a desired impurity concentration is formed in a top portion of the first semiconductor pillar for the first transistor by the ion implantation of an impurity. Thereafter, the fourth mask is removed.

If impurity concentrations in epitaxially-grown layers to be provided on semiconductor pillars different in pillar diameter need to be differentiated from one another, a fifth mask is provided, instead of the step of FIG. 13 in the first exemplary embodiment, so as to cover the region for forming the first transistor. Then, an epitaxially-grown layer containing an impurity having a desired concentration is formed on an upper surface of the second semiconductor pillar for the second transistor. At the moment when an epitaxially-grown layer having a predetermined film thickness is formed, a silicon oxide layer is formed on the epitaxially-grown layer by adding oxygen to a source gas. Thereafter, the fifth mask is removed, and then an epitaxially-grown layer containing an impurity having a desired concentration is formed on an upper surface of the first semiconductor pillar for the first transistor. In order to increase an impurity concentration in the epitaxially-grown layer, the concentration of an impurity to be added to the source gas for epitaxial growth may be increased. In addition, the silicon oxide layer can also be formed by oxidizing the upper surface of the third and fourth diffusion layers in an oxygen atmosphere or by treating the upper surface of the third and fourth diffusion layers with an oxidizer (for example, nitric acid) to oxidize the upper surface.

In the manner described above, it is possible to form the first and second transistors provided with the first to fourth diffusion layers having impurity concentrations different from each other and LDD regions.

Third Exemplary Embodiment

The present exemplary embodiment differs from the first exemplary embodiment in that the semiconductor device is provided with n-channel and p-channel transistors.

In a manufacturing method of the present exemplary embodiment, p-well 35 is formed in a region for forming an n-channel transistor and n-well 36 is formed in a region for forming a p-channel transistor in the step of FIG. 2 in the first exemplary embodiment.

Next, the step of FIG. 3 in the first exemplary embodiment is carried out. Instead of the step of FIG. 4 in the first exemplary embodiment, a first mask layer is formed so as to cover a first fin for the p-channel transistor. Thereafter, using the first mask layer, an impurity of n-conductivity type is ion-implanted into a portion of a semiconductor substrate underneath a second fin for the n-channel transistor, thereby forming a second diffusion layer. Thereafter, the first mask layer is removed, and then a second mask layer is formed so as to cover the second fin. Thereafter, using the second mask layer, an impurity of p-conductivity type is ion-implanted into a portion of the semiconductor substrate underneath the first fin, thereby forming a first diffusion layer.

Figure 21:
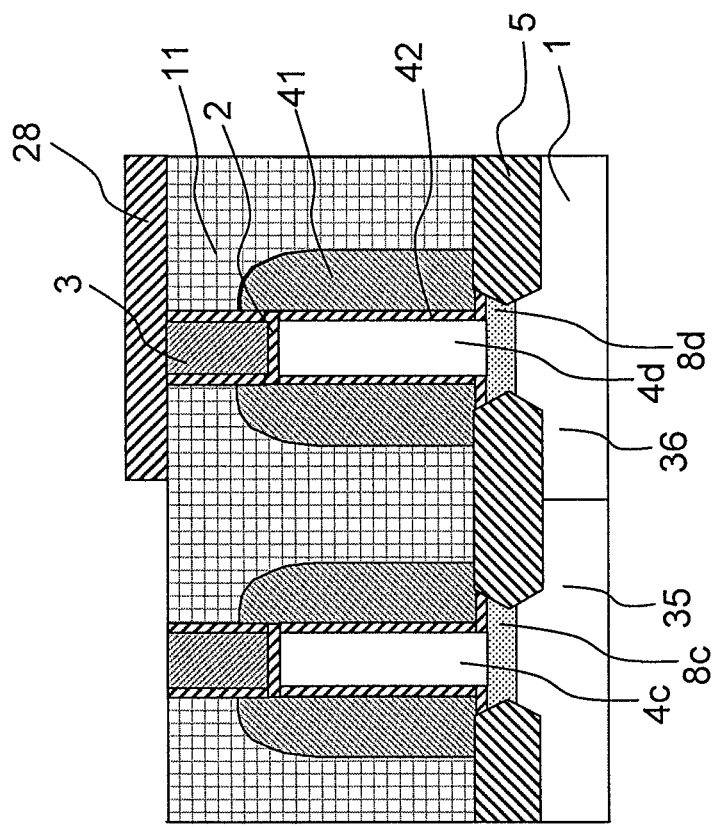
FIG. 21 illustrates that part of first interlayer insulating film 11 is formed and third mask layer 28 is provided on first interlayer insulating film 11 in a third exemplary embodiment.

Next, the steps of FIGS. 5 to 9 in the first exemplary embodiment are carried out. Thereafter, as illustrated in FIG. 21, part of first interlayer insulating film 11 made of a silicon oxide film is formed on the entire surface of the semiconductor substrate. Thereafter, using silicon nitride film 3 as a stopper, a surface of first interlayer insulating film 11 is polished and planarized by a CMP method. Third mask layer 28 is provided on first interlayer insulating film 11, so as to cover first semiconductor pillar 4d for the p-channel transistor.

Figure 22:
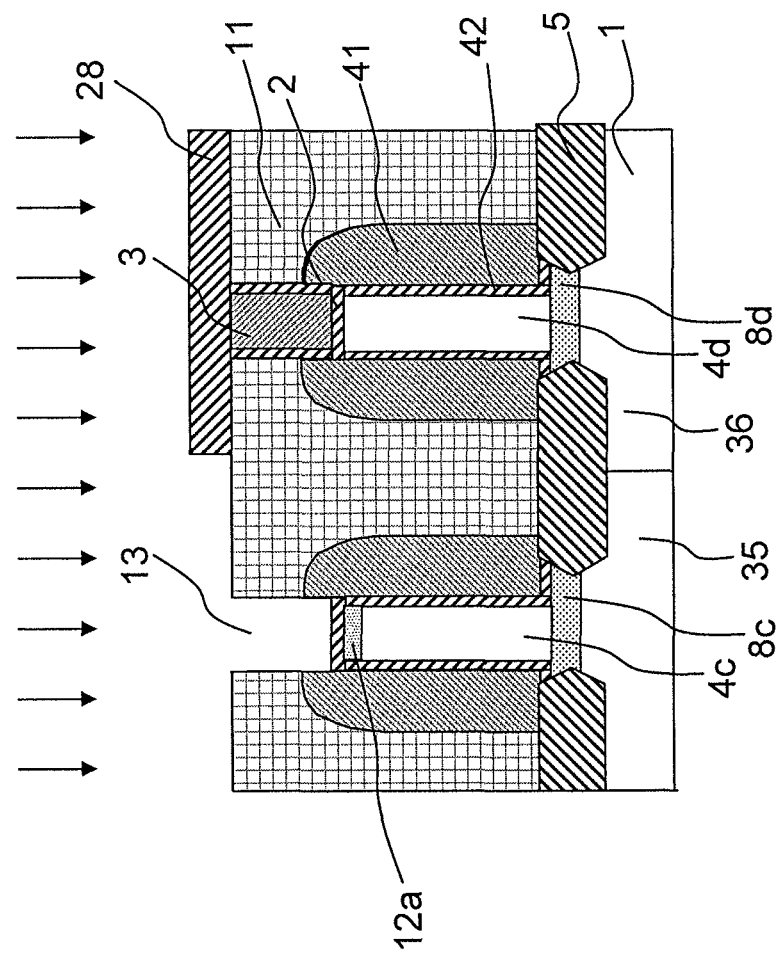
FIG. 22 illustrates that LET region 12a is formed in the third exemplary embodiment.

As illustrated in FIG. 22, silicon nitride film 3 and the like on second semiconductor pillar 4c for the n-channel transistor are removed. Thereafter, using third mask layer 28, LDD region 12a is formed in a top portion of second semiconductor pillar 4c by ion-implanting an impurity of n-conductivity type.

Figure 23:
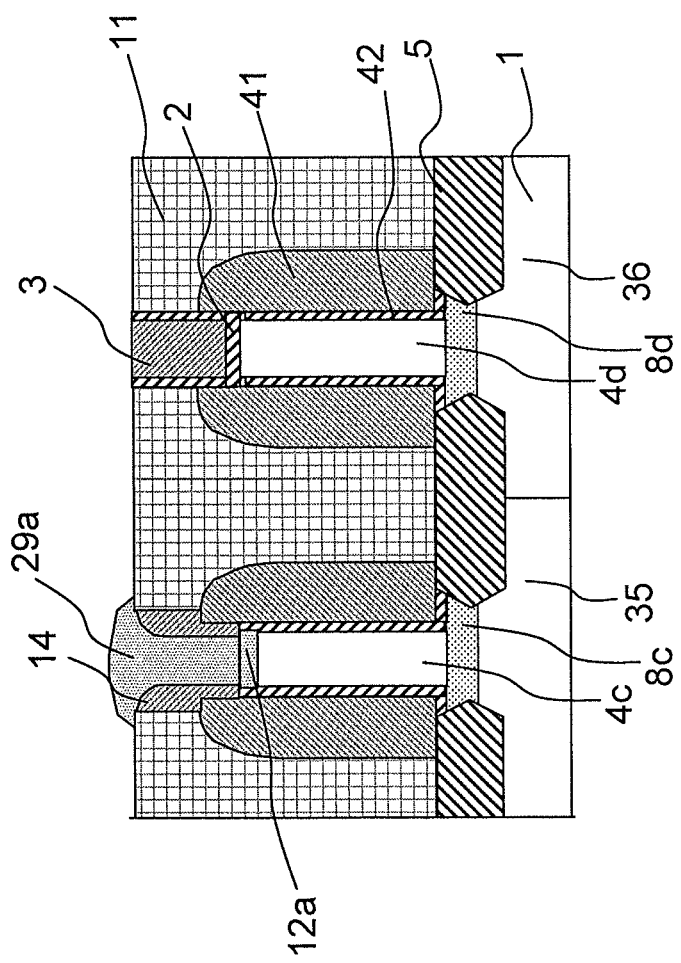
FIG. 23 illustrates that sidewall film 14 and fourth diffusion layer 29a are formed in the third exemplary embodiment.

As illustrated in FIG. 23, a silicon nitride film is formed in hole 13 and then etched back to form sidewall film 14 in hole 13. Silicon containing an impurity of n-conductivity type is epitaxially grown on an upper surface of second semiconductor pillar 4c to form a fourth diffusion layer 29a containing the impurity of n-conductivity type.

Figure 24:
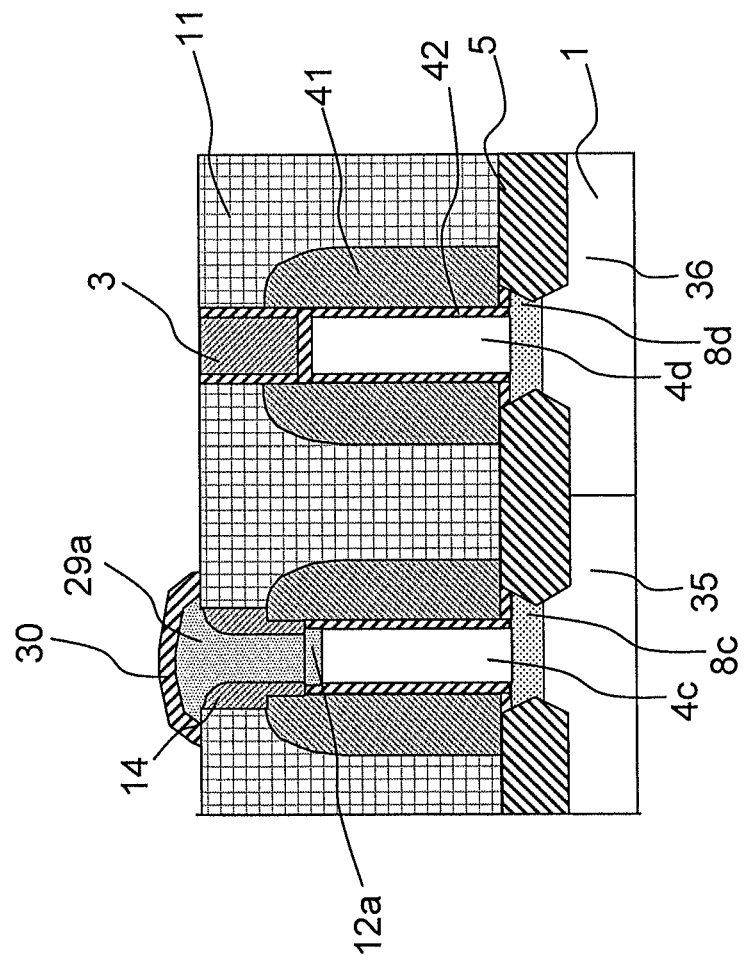
FIG. 24 illustrates that silicon oxide film 30 is formed on an upper surface of fourth diffusion layer 29a in the third exemplary embodiment.

As illustrated in FIG. 24, silicon oxide film 30 is formed on an upper surface of fourth diffusion layer 29a by adding oxygen to a source gas partway through the epitaxial growth step of FIG. 23. A method of forming silicon oxide film 30 is not limited to this method. Alternatively, silicon oxide film 30 can be formed by, for example, oxidizing an upper surface of fourth diffusion layer 29a in an oxygen atmosphere, or treating the upper surface of fourth diffusion layer 29a with an oxidizing agent to oxidize the upper surface. As the oxidizing agent, it is possible to use, for example, nitric acid.

Figure 25:
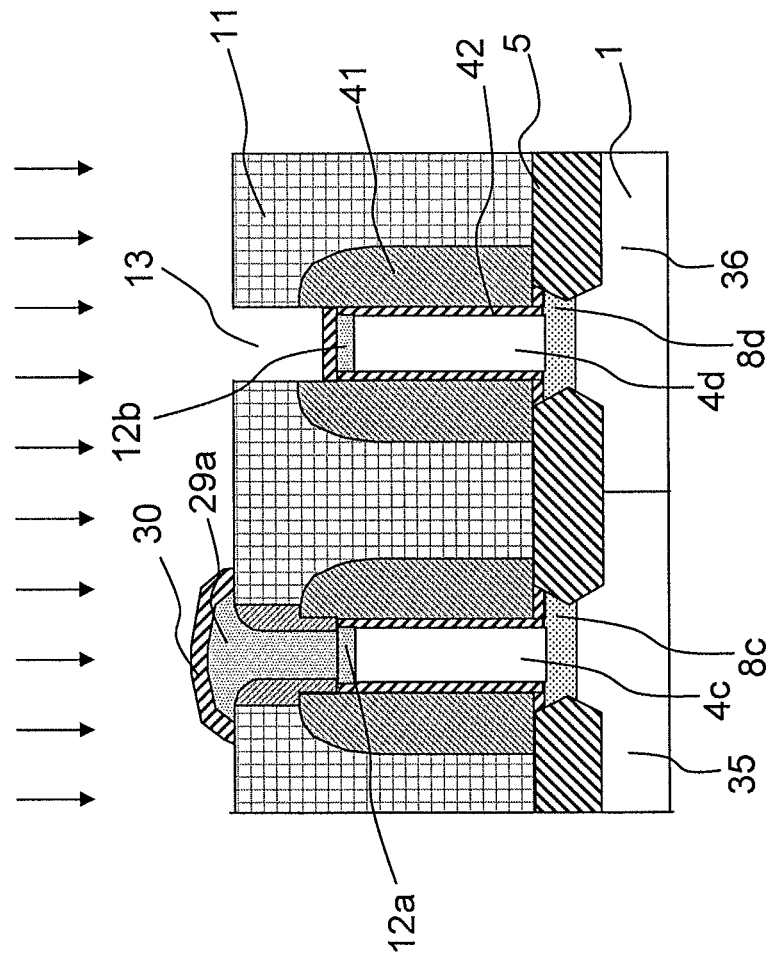
FIG. 25 illustrates that LDD region 12b is formed in the third exemplary embodiment.

As illustrated in FIG. 25, silicon nitride film 3 and the like on first semiconductor pillar 4d for the p-channel transistor are removed. Thereafter, using silicon oxide film 30 as a mask, LDD region 12b is formed in a top portion of first semiconductor pillar 4d by the ion implantation of an impurity of p-conductivity type.

Figure 26:
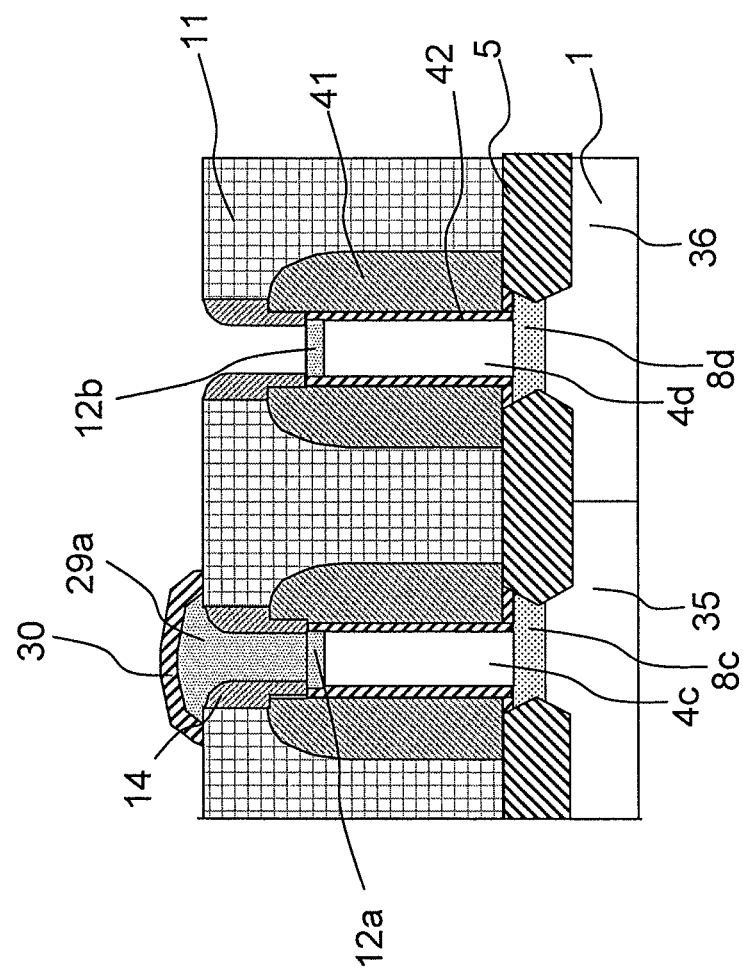
FIG. 26 illustrates that sidewall film 14 is formed in hole 13 in the third exemplary embodiment.

As illustrated in FIG. 26, a silicon nitride film is formed in hole 13 and then etched back to form sidewall film 14 in hole 13.

Figure 27:
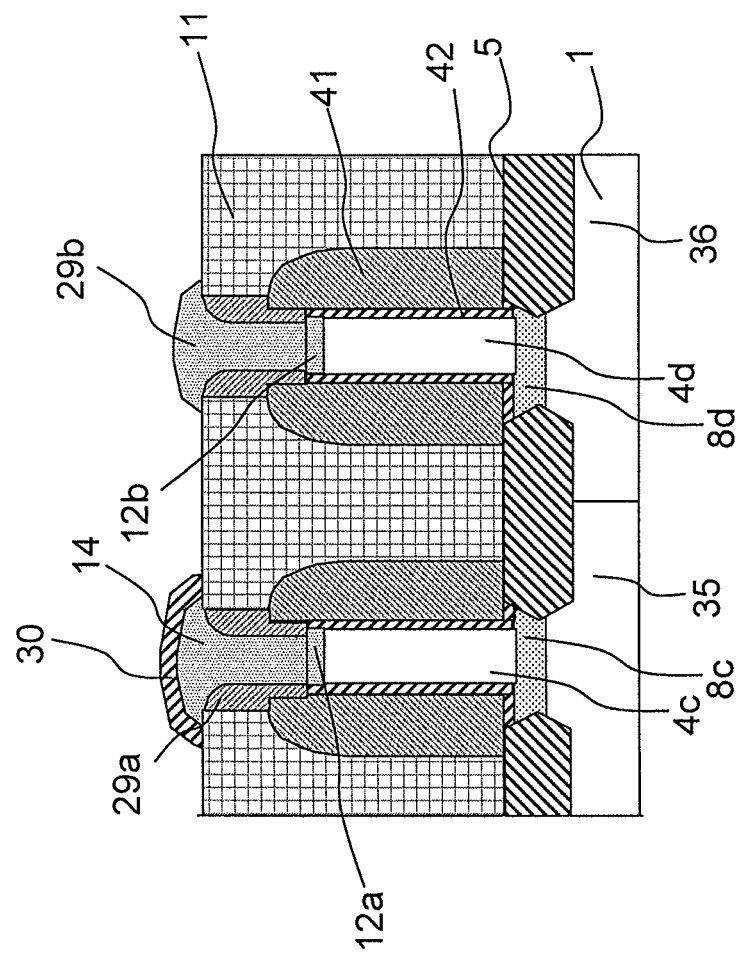
FIG. 27 illustrates that third diffusion layer 29b is formed in the third exemplary embodiment.

As illustrated in FIG. 27, silicon containing an impurity of p-conductivity type is epitaxially grown on an upper surface of first semiconductor pillar 4d to form a third diffusion layer 29b containing the impurity of p-conductivity type.

In the manner described above, it is possible to form the n-channel and p-channel transistors provided with the first to third diffusion layers having impurity concentrations different from each other and LDD regions.

In the present exemplary embodiment, oxygen is supplied at the end of the step of forming fourth diffusion layer 29a on the upper surface of second semiconductor pillar 4c by epitaxial growth. Consequently, silicon oxide film 30 can be formed on fourth diffusion layer 29a in a self-aligned manner. Thus, epitaxial growth does not take place in locations covered with the silicon oxide film. Accordingly, this silicon oxide film 30 functions as a mask for epitaxial growth in a later step of forming third diffusion layer 29b on an upper surface of first semiconductor pillar 4d by epitaxial growth. As a result, according to the manufacturing method of the present exemplary embodiment, it is possible to reduce the number of manufacturing steps.

In the description given above, an example has been cited in which the pillar diameters of all semiconductor pillars are the same. In the present exemplary embodiment, however, the pillar diameters of respective semiconductor pillars may be different.

Fourth Exemplary Embodiment

The present exemplary embodiment differs from the first exemplary embodiment in that top diffusion layer 15 including an impurity-containing polysilicon film is formed by an LPCVD (low pressure chemical vapor deposition) method. The present exemplary embodiment differs from the first exemplary embodiment only in the step of forming top diffusion layer 15 illustrated in FIG. 13. Accordingly, only the step of forming the top diffusion layer 15 will be described here and other steps will not be described.

In the present exemplary embodiment, a polysilicon layer opposite in conductivity type to a semiconductor pillar and containing an impurity is formed on an upper surface of the semiconductor pillar by an LPCVD method. The impurity-containing polysilicon layer can be formed by adding a doping gas for the impurity to a source gas for LPCVD. Thereafter, the polysilicon layer is planarized in the same way as in the first exemplary embodiment to form a top diffusion layer.

After an amorphous silicon film is formed by an LPCVD method, the amorphous silicon film may be converted to a polysilicon film in a later step by performing a heat treatment.

Forming the polysilicon layer by epitaxial growth has the characteristic of being able to easily achieve low resistance with a small contact area, compared with a case in which the polysilicon layer is formed by an LPCVD method. Even in the case of the present exemplary embodiment in which an LPCVD method is used, however, it is possible in practice to form a top diffusion layer sufficiently low in resistance.

It is apparent that the present invention is not limited to the above embodiments, but may be modified and changed without departing from the scope and spirit of the invention.

What is claimed is:

1. A method of manufacturing a device, the method comprising:
    forming a semiconductor pillar having a first conductivity type protruding from a semiconductor substrate;
    forming a bottom diffusion layer having a second conductivity type in the semiconductor substrate around a bottom of the semiconductor pillar;
    forming a gate insulator film covering a side surface of the semiconductor pillar;
    forming a gate electrode covering the gate insulator film; and
    forming a top diffusion later having the second conductivity type at a top portion of the semiconductor pillar, the top diffusion layer including a semiconductor body is formed by an epitaxial growth which contains an impurity,
    wherein the forming the semiconductor pillar is to form a first semiconductor pillar and a second semiconductor pillar, the first semiconductor pillar including an n-type impurity being disposed in an n-well region and the second semiconductor pillar including a p-type impurity being disposed in a p-well region;
    wherein the forming the bottom diffusion layer further comprises:
        forming a first mask layer which covers the n-well region;
        forming, with the first mask layer as a mask, a second diffusion layer by implanting a n-type impurity in the semiconductor substrate around a bottom of the second semiconductor pillar which is in the p-well region;
        removing the first mask layer;
        forming a second mask layer which covers the p-well region;
        forming, with the second mask layer as a mask, a first diffusion layer by implanting a p-type impurity in the semiconductor substrate around a bottom of the first semiconductor pillar which is in the n-well region; and
        removing the second mask layer; and
    wherein the forming the top diffusion layer further comprises:
        forming a third mask layer which covers the n-well region;
        forming a fourth diffusion layer by an epitaxial growth of a semiconductor which includes an n-type impurity at a top portion of the second semiconductor pillar;
        forming an insulating layer over the fourth diffusion layer;
        removing the third mask layer; and
        forming a third diffusion layer by an epitaxial growth of a semiconductor which includes a p-type impurity at a top portion of the first semiconductor pillar.

2. The method of manufacturing the device according to claim 1, further comprising after the forming the gate electrode and before the forming the top diffusion layer, forming a lightly doped drain layer having the second conductivity type at the top portion of the semiconductor pillar by implanting an impurity.

3. The method of manufacturing the device according to claim 1, wherein the first conductivity type is p-type and the second conductivity type is n-type.

4. The method of manufacturing the device according to claim 3, wherein the epitaxial growth uses source gases including a doping gas which contains at least one of phosphorus and arsenic.

5. The method of manufacturing the device according to claim 1, wherein the first conductivity type is n-type and the second conductivity type is p-type.

6. The method of manufacturing the device according to claim 5, wherein the epitaxial growth uses source gases including a doping gas which contains boron.

7. The method of manufacturing the device according to claim 1, wherein the forming the semiconductor pillar is to form a plurality of the semiconductor pillars having a same width as each other.

8. The method of manufacturing the device according to claim 1, wherein the forming the semiconductor pillar is to form a plurality of the semiconductor pillars having different widths respectively.

9. The method of manufacturing the device according to claim 8, wherein the forming the top diffusion layer is to form most top diffusion layers having the same impurity concentration as each other.

10. The method of manufacturing the device according to claim 8, wherein the forming the top diffusion layer is to form a plurality of the top diffusion layers corresponding to each of the plurality of the semiconductor pillars; and
    wherein the top diffusion layers have different impurity concentrations each associated with different widths.

11. The method of manufacturing the device according to claim 10, wherein the forming the semiconductor pillar is to form a first semiconductor pillar and a plurality of second semiconductor pillars, the second semiconductor pillars having larger width than the first semiconductor pillar;
    wherein the forming the top diffusion layer further comprises:
        forming a mask layer which covers the first semiconductor pillar;
        forming a fourth diffusion layer of a first impurity concentration over a top portion of the second semiconductor pillar by the epitaxial growth;
        forming an insulating layer which covers the top portion of the fourth diffusion layer;
        removing the mask layer and exposing a top portion of the first semiconductor pillar; and
        forming a third diffusion layer of a second impurity concentration over the top portion of the first semiconductor pillar by the epitaxial growth.

12. The method of manufacturing the device according to claim 1, further comprising after the forming the third mask layer and before the forming the fourth diffusion layer, forming a lightly doped drain layer by implanting an n-type impurity at the top portion of the second semiconductor pillar;
    further comprising after the removing the third mask layer and before the forming the third diffusion layer, forming a lightly doped drain layer by implanting a p-type impurity at the top portion of the first semiconductor pillar.

13. The method of manufacturing the device according to claim 1, wherein the forming the insulating layer is to form a silicon oxide on the fourth diffusion layer using any one of three methods as follows:
    (1) oxidation by mixing oxygen in source gases at the last step of the epitaxial growth,
    (2) thermal oxidation using oxygen ambient,
    (3) chemical oxidation using an oxidizer.

14. The method of manufacturing the device according to claim 13, wherein the oxidizer is nitric acid.

15. The method of manufacturing the device according to claim 1, wherein each of the third and the fourth diffusion layers has impurity concentration ranging from $1.0 \times 10^{19}$ $cm^{-3}$ to $1.0 \times 10^{20}$ $cm^{-3}$, respectively.

16. The method of manufacturing the device according to claim 1, further comprising after the forming the top diffusion layer:
- forming a storage element to connect the top diffusion layer electrically, the storage element having an upper electrode and a lower electrode; and
- forming a bit line which electrically connects to either the upper electrode or the lower electrode.

* * * * *